United States Patent [19]
Murakami et al.

[11] Patent Number: 5,818,284
[45] Date of Patent: Oct. 6, 1998

[54] CONTROLLER FOR POWER BIPOLAR TRANSISTOR

[75] Inventors: Yoshinori Murakami, Tokyo; Kazuma Ohkura, Kanagawa-ken; Yasuhiko Kitajima, Kanagawa-ken; Kazuhiko Tani, Kanagawa-ken, all of Japan

[73] Assignee: Nissan Motor Co., Ltd., Yokohama, Japan

[21] Appl. No.: 693,526

[22] Filed: Aug. 8, 1996

[30] Foreign Application Priority Data

Aug. 9, 1995 [JP] Japan .................................. 7-202991

[51] Int. Cl.$^6$ .................................................. H03K 17/60
[52] U.S. Cl. ............................ 327/478; 327/427; 327/432
[58] Field of Search ..................................... 327/427, 430, 327/431, 432, 434, 435, 437, 478, 482

[56] References Cited

U.S. PATENT DOCUMENTS

| | | | |
|---|---|---|---|
| 4,095,127 | 6/1978 | Nerem | 307/253 |
| 4,491,744 | 1/1985 | Corey | 307/270 |
| 5,055,722 | 10/1991 | Latos et al. | 307/570 |
| 5,359,244 | 10/1994 | Hopkins | 307/571 |
| 5,446,406 | 8/1995 | Gantioler et al. | 327/427 |

*Primary Examiner*—Timothy P. Callahan
*Assistant Examiner*—An T. Luu
*Attorney, Agent, or Firm*—Foley & Lardner

[57] ABSTRACT

A base current controlling circuit for a power bipolar transistor comprising a first controlling device giving the base current only two states which are a "conduction" state and a "cut-off" state, and a second controlling device adjusting the condition of the power bipolar transistor to a predetermined preferable condition by controlling the base current value in response to a result of detection of a condition of the power bipolar transistor.

21 Claims, 15 Drawing Sheets

CONTROLLER FOR POWER BIPOLAR TRANSISTOR

BACKGROUND OF THE INVENTION

1. Field of the Invention

The present invention relates to a controller for a current-controlled type power bipolar transistor.

2. Description of the Prior Art

A circuit configuration shown in FIG. 1 will be presented as a first prior art. In FIG. 1, Q1 denotes an npn type power bipolar transistor whose emitter terminal is connected to ground and collector terminal is connected to positive potential via a load X. Qu and Qd are MOSFETs which supply/extract power to/from the base of the transistor Q1. The Qu and Qd are formed complementarily. The Qu is a p-channel MOSFET whose source terminal is kept at positive potential Vp, while the Qd is an n-channel MOSFET whose source terminal is kept at ground level (=0 V) or negative potential Vn. The gate terminals of Qu and Qd are connected to a terminal G, as shown in FIG. 1, so that a same control signal can be applied to the gate terminals. Both drain terminals are connected to the base terminal of Q1 via a base resistor Rx.

An operation of the circuit will be explained hereinafter. If a predetermined positive potential is applied to the gate terminal G, the transistor Qu is in cut-off state and the transistor Qd is in conduction state, and the transistor Q1 is in cut-off state because its base potential is negative. If a predetermined negative potential is applied to the gate terminal G, the transistor Qu becomes conduction state while the transistor Qd becomes cut-off state, and current is supplied to the base terminal of the transistor Q1 via the resistor Rx. A current value is given by about Vp/Rx at this time. A resistance value of the resistor Rx must be a relatively small value so that a minimum base current required for a rated collector current can be supplied to the transistor Q1.

In this manner, a configuration for controlling the transistor by two-state on/off value has been used as transistors Q11 to Q16 which are constituent elements of a three-phase PWM inverter, as shown in FIG. 2, for example. However, in the case where the foregoing controlling device is used as the constituent elements of the three-phase PWM inverter, as shown in FIG. 2, in a driving circuit for an electric vehicle, for instance, in the situation that the load and the current value of the controlling device are changing every moment, sometimes problems have arisen as follows. If travel of the vehicle would be taken as an example, the rated current flows in the transistor only on the occasions when the motor is required to output its maximum torque at the time the vehicle should be accelerated on a steep ascent, and so on. Only a current which is considerably small rather than the rated current flows through the transistor for most of travelling period. In such situation, the base current is supplied excessively. Therefore, not only the base current is of no use but also saturation of the base region of the power bipolar transistor is brought about, and therefore storage time is extended when the transistor is turned off. This causes consequently such a problem that either an upper limit of PWM carrier frequency is lowered or the range of pulse width modulation is limited. For this reason, it is of course that such a concept has be proposed that an appropriate base current would be supplied correspondingly to a main current value which flows through the power bipolar transistor. However, it was not so important enough to take into account conventionally since PWM carrier frequency employed was about 2 kHz which was sufficiently low compared to a switching rate of the transistor.

As a method of solving the above problem, a circuit (hereinafter called "the second prior art") shown in FIG. 3A has also been proposed. The circuit has set forth in "Forklift Controller Using SIT" (Tamotsu YASUDA, Toshio YOSHIZAWA; Material No. EDD-90-64/SPC-90-63, pp.57–64) which is a paper of the Joint Symposium on Electronic Device and Power Conversion using Semiconductor Device sponsored by the Institute of Electrical Engineers of Japan, held in October of 1990. A mechanism of the circuit will be explained hereinafter. The circuit shown in FIG. 3A has been presented as a part of the circuit for driving a DC motor by chopper system basically, an operation of the circuit is almost similar in principle to that of the transistor used in the three-phase PWM circuit, as shown in FIG. 2. The SIT (Static Induction Transistor) in FIG. 2 is a bipolar-mode SIT (BSIT) which is current-drive type device here, and that behavior is same as a bipolar transistor.

In controlling the SIT circuit, if the circuit shown in FIG. 1 is used, extreme increase in storage time is caused when the drain current flowing through the BSIT is low. Therefore, in the circuit in FIG. 3A, "on-state gate driver" supplies the gate current to the BSIT basically for the period when a chopper signal to the BSIT is in "on state". But when a signal supplied from "$V_{DS}$ detector" which detects a voltage $V_{DS}$ between drain-source of the SIT becomes low rather than "reference $V_{DSB}$", an output of a "comparator" becomes "H" and thus a "on-state gate driver" causes to cease supplying of the gate current. The BSIT continues to flow the main current because of the storaged excessive carrier for a while even after the gate current supply is ceased, and $V_{DS}$ is increased gradually with reduction of excessive carrier. Then an output of a "comparator" becomes "L", which serves to flow the gate current into BSIT by "on-state gate driver" again.

FIG. 3B is a characteristic diagram showing behavior of the gate current and behavior of drain-source voltage $V_{DS}$ of the BSIT. During a period when a chopper signal is "on-state", supplied from an external control device, $V_{DS}$ remains within a certain range having a constant center value of $V_{DSB}$, and the BSIT does never fall into saturation region even if the main current value is low.

However, the followings are problems caused in the above circuit configuration. First, there is a problem that a large current is required to the gate terminal in a pulse fashion. Because, when the pulse current flows in the circuit in FIG. 3A, the large gate current which permits the rated drain current flows, the device would always repeats a history, during on state, such that it enters into serious saturation region once, and then it recovers gradually. Since the operation of the "comparator" is independent of an external chopper signal generator, the BSIT may turn off with a relatively long storage time, in case the off-state gate driver operates at the timing immediately after the pulse gate current flows and the SIT falls into a saturation state. According to the configuration shown in FIG. 3A, the storage time may becomes unstable, particularly in the low current region when the device being in turn-off state.

Second, the pulse frequency generated by the "comparator" which supplies the pulse signal to the "on-state gate driver" may be realized on the assumption that lifetime of excessive minority carriers in the BSIT is enough long relative to the operation speed of the "comparator". In other words, the frequency of the "comparator" cannot always catch up the change of the carrier state in the transistor which has short carrier lifetime, and it is possible that appropriate gate control cannot be achieved and an amplitude of the $V_{DS}$ may increase.

Third, as shown in FIG. 3A, the "on-state gate driver" must accept signals for gate current driving not only from the external signal generator but also from the "comparator" which sends a signal by the result of comparison between the detected voltage $V_{DS}$ and the reference voltage $V_{DSB}$. In other words, although the circuits expressed as the "on-state gate driver" and the "off-state gate driver" may correspond to the transistors Qu and Qd in the simple configuration in FIG. 1, to use the circuit shown in FIG. 3A, the above-mentioned circuit in the simple configuration must be modified. That is because this system requires to add a new mechanism to change behavior in response to a new external signal, that is from the "comparator". This means that an overall configuration of existing device must be changed essentially.

As stated above, in the simple circuit like the first prior art, there are problems that the base current of the transistor cannot be adjusted according to status of the load, that storage time is extended since the transistor becomes saturation region under almost all use conditions, and that the base current is wasted in the low current region.

In the configuration like the second prior art, storage time may become unstable at some specific timings, although it is feasible to adjust states of the transistor according to the load. Further, the configuration of the second prior art cannot always respond to any current-controlled type transistor, and the control current supplying circuit must be reconstructed.

SUMMARY OF THE INVENTION

An object of the present invention is to solve the above problems and to realize a controller for power bipolar transistor that enables to reduce the storage time, and realize a high switching speed with a method to add a simple circuit and not to modify the conventional configuration. And it is also another object of the present invention that to realize a controller for power bipolar transistor to optimize the base current according to the main current (collector current) of a power bipolar transistor.

In order to achieve the above object, the present invention includes first to fourth features described hereinbelow.

(A) More particularly, the first feature of the present invention resides in that, as shown in FIG. 4, there are provided a first controlling device 1 as a control device for driving a power bipolar transistor Q1 to give its base terminal B two kind of signals, i.e., a "conduction" signal (providing a constant potential to supply a base current) and a "cut-off" signal (providing a constant potential, for instance, 0 V or the potential having opposite polarity to that of the conduction signal to extract turn-off base current from a base terminal B) in response to a first external signal S1, and a second controlling device which operates independently of the first controlling device. As shown in FIGS. 6, 7, 9, etc., the second controlling device includes at least detecting means for detecting a condition of the power bipolar transistor Q1 in conduction state, and a control transistor Q2 such as a MOSFET having two main terminals (source and drain terminals) through which the required base current flows into, or extracts from the base terminal and a control terminal for adjusting a resistance value between the two main terminals to control the base current of the power bipolar transistor Q1 within a predetermined range in response to the result of detection by the detecting means. The "first controlling device 1" corresponds to a controlling device which is used conventionally to drive a current-controlled type transistor such as the bipolar transistor. More particularly, the first controlling device 1 is composed of the MOSFETs Qu, Qd and a power source Vp, Vn connected thereto, as shown in FIGS. 6, 7, 9, etc., and it has only function to receive a first signal from an external signal generator and then provide two kinds of signal, i.e., a conduction signal (i.e., positive potential to supply the base current here) and a cut-off signal (i.e., negative or zero potential to extract the current from the base terminal here), to the base terminal B. It is preferable that the detecting means in the first feature of the present invention is constructed to have function for detecting at least potential difference between the collector terminal and the emitter terminal, as shown in FIGS. 6 and 7, or function for detecting at least a current value passing through the collector terminal or the emitter terminal, as shown in FIGS. 14, 15, and 17.

In addition, in the first feature of the present invention, it is preferable that, as shown in FIG. 6, in order to extract the turn-off base current quickly even when the control transistor Q2 is in cut-off state or resistance between the main terminals is high, a rectifying diode (a bypass diode) D1 is connected between two main terminals of the control transistor Q2 and also polarity of the rectifying diode (bypass diode) D1 is selected to flow the turn-off current only in the direction opposite to that of the turn-on base current or the current which makes the power bipolar transistor Q1 conductive. Alternatively, it is preferable that, as shown in FIG. 9, in order to limit a maximum value of the resistance value between the main terminals when the control transistor Q2 is in cut-off state or resistance between the main terminals is high, a fixed resistance (bypass resistance) R3 is connected in parallel to two main terminals of the control transistor Q2. In the configuration that the bypass diode D1 is connected in parallel as shown in FIG. 6, when the power bipolar transistor Q1 is turned off from its conduction state where the collector current is low and accordingly the base current is suppressed small, the turn-off base current can be passed via the low resistance bypass diode D1 bypassing the control transistor Q2. Hence, the control transistor Q2 being held in its high resistance state does not prevent the extraction of the turn-off base current which is required for the turn-off operation of the transistor Q1. Moreover, as shown in FIG. 9, if the fixed resistor R3 is connected in parallel, minimal base current can flow through the resistor R3, even if the collector current required for the power bipolar transistor Q1 becomes small and corresponding base current is set to be a small level by the control transistor Q2. Hence, it can be prevented that state of the control transistor Q2 becomes unstable, and therefore malfunction of the power bipolar transistor due to the unstable operation of the control transistor Q2 is suppressed. In other words, by parallel connection of the fixed resistor R3, the minimum on-state base current supplied to the power bipolar transistor Q1 can be assured to stabilize operation of the power bipolar transistor Q1.

According to the first feature of the present invention, in addition to the first controlling device 1 which is equivalent to the prior art (first example in the prior art), the second controlling device 2 is provided which is composed at least of the detecting means for detecting the condition of the power bipolar transistor Q1 and the control transistor Q2 for adjusting appropriately the base current to be flowed into or be extracted from the base terminal of the power bipolar transistor Q1. By the second controlling device 2, the condition of the power bipolar transistor Q1 varying according to the load can be controlled finely. If an npn bipolar transistor is given as the power bipolar transistor Q1 for purposes of example, the fact that the collector potential is lower than a certain value in its conduction state means that the bipolar transistor is in saturation region and that the base current is supplied excessively. In such a condition, not only the power conversion efficiency becomes low but also the storage time becomes long because of excessive carrier storage effect, and the turning off operation of the power bipolar transistor Q1 becomes slow. Accordingly, in the case of such a condition, the second controlling device 2 serves to limit the turn-on or on-state base current by detecting the collector potential by the detecting means shown in FIGS. 6 and 7. On the contrary, the condition that the collector potential is higher than a certain value means the resistance between main terminals of the power bipolar transistor Q1 is high, which leads to heat generation of the power bipolar transistor Q1. Therefore, in the case of such a condition, the second controlling device 2 acts to increase the on-state base current by detecting the collector potential. According to such controlling operations of the base current by the second controlling device 2, the collector potential of the power bipolar transistor Q1 can be controlled to settle within a predetermined range. In addition, when the collector-emitter voltage is increased high close to the power supply voltage as the power bipolar transistor Q1 is in cut-off state, the second controlling device 2 flows the base current with small conduction loss or small resistance on the basis of the above discussion. Then, if the first controlling device 1 transfers from the "cut-off state" to the "conduction state" and thus begins to supply the turn-on base current, it is ready that a large turn-on base current can be supplied to the power bipolar transistor Q1 and turn-on operation thereof can be carried out quickly, Further, when the first controlling device 1 transfers from "conduction" state to "cut-off" state, it serves to extract the turn-off base current from the power bipolar transistor Q1. Then, when the collector potential raises, the second controlling device 2 acts to flow the turn-off base current with low conduction loss. Therefore, extraction of the turn-off base current is carried out quickly to proceed turn-off quickly even if the conduction state base current is limited in immediately prior conduction state.

Besides, in case the power bipolar transistor drives the inductive load such as the motor as the constituent element of the PWM inverter, it does not operate for a certain period in fact due to its negative collector potential although it is in conduction state. In this event, the on-state base current being supplied is of no use in the prior art. However, in the present invention the second controlling device 2 acts not to flow the base current as much as possible because the fact that "the collector potential is negative" means "it is lower than a certain value (positive)". In other words, the on-state base current which is supplied by the first controlling device 1 is cut off by the second controlling device 2 so that base drive power can be saved during this period. Similar control may be effected by detecting the collector current or the emitter current. Namely, as shown in FIGS. 14, 15 and 17, when the second controlling device detects the collector current value or the emitter current value as state of the power bipolar transistor Q1, an appropriate base current value can be calculated according to either of the collector or the emitter current value and the characteristics of the transistor. And the calculated base current is injected to the power bipolar transistor Q1, appropriately.

(B) In FIG. 4, the first controlling device 1 is connected between the power source 3 and the second controlling device 2 to flow or extract the base current to or from the base terminal B. However, order of the first controlling device 1 and the second controlling device 2 may be reversed in the present invention. In particular, as shown in FIGS. 10 and 11, as the second feature of the present invention, similar operation to that achieved according to the first feature of the present invention can be effected by the configuration wherein the second controlling device 2 is arranged between the power source 3, which supplies the base current to bring the power bipolar transistor into conduction state, and the first controlling device 1. The first controlling device 1 which is equivalent to the controlling device in the first prior art consists of at least MOSFETs Qu and Qd, as shown in FIG. 11, and supplies the base current as a conduction signal or extracts the turn-off base current as a cut-off signal according to the the first signal S1 input by externally into the common gate G of the device 1. The "second controlling device 2" is a controlling device having a control transistor Q2 which is interposed between the power source 3 and the first controlling device 1. The second controlling device 2 detects a condition of the power bipolar transistor Q1 by detecting means, and thereby adjust appropriately the base current which is supplied through the first controlling device 1 to the base terminal B of the transistor Q1. Here "a condition of the transistor Q1" means collector current value, collector voltage value, emitter current value, emitter voltage value, base current value, base voltage value, temperature, etc. With the above configuration, the base current can be controlled by the control transistor Q2 when the MOSFET Qu is conducted, thereby providing the appropriate on-state base current for the transistor Q1. Further, since the current extracted from the base terminal flows without passing through the control transistor Q2 when the MOSFET Qd is turned on, quick turn-off of the transistor Q1 can be attained even if a bypass diode is not connected to the control transistor Q2 in parallel. The quick turn-off operation is also attained by employing a transistor without such parasitic bypass diode by the configuration of the second feature.

(C) As shown in FIGS. 12, 15 and 17, the third feature of the present invention is that the load consisting of the inductive load L1 and the free wheeling diode D3, both connected in parallel is electrically coupled to either of the collector terminal and the emitter terminal of the power bipolar transistor. More particularly, the inductive load L1 can be considered as equivalent representation of DC motor, AC motor, or the like. In other words, the third feature of the present invention resides in the configuration comprising the power bipolar transistor Q1 connected to the load composed of the inductive load L1 and the free wheeling diode D3; the first controlling device 1; and the second controlling device having the detecting means. The detecting means can know the main current flowing through the main terminals of the power bipolar transistor Q1 in conduction state by detecting the current passing through the inductive load L1. In FIG. 15, the second controlling device 2 is made up of the control transistor (MOSFET) Q2 and the operational amplifier A. The operational amplifier A controls the potential of the control electrode of the control transistor Q2 in response to the detected results of the current passing through the inductive load L1. Furthermore, as shown in FIG. 17, in the third feature of the present invention, it is preferable that the second controlling device has a function as follows: when the power bipolar transistor Q1 starts to transfer from "conduction" state to "cut-off" state in response to the second signal S2 supplied externally, the resistance of the control transistor Q2 is fixed in high resistance state, and when the power bipolar transistor Q1 transfers from "cut-off" state to "conduction" state, the fixed high resistance state of the control transistor Q2 is held until the main current passing through the main terminals of the power bipolar transistor Q1 passes through its maximal value. The maximal value is caused by the reverse recovery current in the free wheeling diode D3 as shown in FIG. 18.

By the configuration of the third feature of the present invention as shown in FIG. 15, the base current is adjusted appropriately by detecting the collector current of the power bipolar transistor Q1, and larger base current is utilized if larger collector current is required, and conversely smaller base current is used if the collector current becomes smaller. As the base current is zero in "cut-off" state of the power bipolar transistor Q1, it may seem to be impossible for the power bipolar transistor Q1 to transfer from "cut-off" state to "conduction" state. Nevertheless, in the case of the configuration according to the third feature of the present invention wherein the power bipolar transistor Q1 drives the inductive load and the free wheeling diode, the current still flows to a certain extent into the load by the free wheeling diode even when the power bipolar transistor Q1 is in cut-off state. Therefore, such current can be detected. When the power bipolar transistor Q1 is in conduction state, the current passing through the load is equivalent to the main current passing through the power bipolar transistor Q1. If the base current is decided with reference to such current upon transferring of the transistor Q1 from cut-off state to conduction state, appropriate base current can be supplied by the ordinary pulse drive system.

Moreover, as shown in FIG. 17, as another function of the second controlling device, if the control transistor Q2 is fixed in high resistance state when the power bipolar transistor Q1 transfers from "conduction" state to "cut-off" state in response to the second signal S2, the appropriate base current can be supplied to the power bipolar transistor Q1 even at the initial period of succeeding conduction state. On the other hand, when the power bipolar transistor Q1 transfers from "cut-off" state to "conduction" state, the high resistance state of the control transistor Q2 is not released until the main current of the power bipolar transistor Q1 passes through its maximal value because of reverse recovery current in the free wheeling diode D3. According to the operation based on the third feature of the present invention, the power bipolar transistor Q1 can receive the base current of appropriate magnitude quickly from the initial period of conduction. For this reason, excessive storage of minority carrier can be avoided to permit high speed turn-off.

In order to avoid excessive storage of minority carrier in the base region, as shown in FIG. 12, in addition to the above function, the second controlling device may have a following function: the second controlling device may fix the resistance value of the control transistor Q2 in response to the second signal S2 when the power bipolar transistor Q1 starts to transfer from "conduction" state to "cut-off" state, and may release such fixed resistance state of the control transistor Q2 after it is detected the both signals of the second signal S2 and the signal that potential difference between the collector terminal and the emitter terminal is reduced less than a predetermined value, when the power bipolar transistor Q1 transfers from "cut-off" state to "conduction" state, conversely. According to the configuration shown in FIG. 12, the power bipolar transistor Q1 is quickly supplied with the appropriate base current value. Namely, since no excessive base current is supplied in the turn-on transition process, the high speed turn off transition is accomplished.

In the third feature of the present invention, the first signal, potential on the output terminal of the first controlling device, or a signal having the same behavior as the above may be used as the second signal S2. Potential difference between the collector terminal and the emitter terminal may also be used. Otherwise, a signal generated by detecting directional change of the base current may be used as the second signal S2.

(D) As shown in FIG. 19, the fourth feature of the present invention is present in respect that a large current semiconductor device such as a power module can be provided wherein a plurality of power bipolar transistors (or sub-transistors) are connected by coupling respective collector (sub-collector) terminals and respective emitter (sub-emitter) terminals together. In the fourth feature of the present invention, for these plural power bipolar transistors, the first controlling device (Qu, Qd) is connected in common while the second controlling device comprising a first control transistor Q2 and a plurality of second control transistors (Qaa, Qbb) which are connected to the individual power bipolar transistors (sub-transistors) respectively so as to control their base currents independently. The second controlling device detects the current values flowing through the main terminals (sub-collectors or sub-emitters) of respective power bipolar transistors (sub-transistors) by the detecting means (H1, H2) in addition to the function described as the first, second or third feature of the present invention, and controls the base currents passing through respective base (sub-base) terminals to eliminate difference in theses current values. According to the fourth feature of the present invention, since respective base currents are controlled so as to cancel the difference in theses current values, thermal imbalance of these sub-transistors can be prevented. Therefore, current concentration in a particular unit transistor can be avoided so that stable large current and high voltage operation can be assured.

As has been previously explained, according to the first to fourth features of the present invention, the advantages of the present invention are summarized as follows. First, it is feasible to build up the collector current rapidly by supplying a great amount of base current instantly in a turn-on period of the power bipolar transistor. Second, it is feasible to extract the turn-off base current quickly with an appropriate value in turn-off period. Third, appropriate base current can be supplied correspondingly to the collector potential or collector current upon turn on, and therefore power dissipated to supply the base current can be saved and storage time in turn off can be decreased because excessive carriers are not supplied. Fourth, it is feasible to decrease the power dissipation in the control circuit even in a case that the inductive load is connected to the power bipolar transistor. Namely, in a PWM-controlled circuit for driving the motor, there exists a period where, in spite of the on signal output from the control circuit, the transistor does not operate actually because of negative $V_{CE}$, and the base current is cut off automatically by the present invention during this period, thereby saving the power dissipation. Finally, cooling equipments for the power bipolar transistors can be reduced based on these advantages.

As shown is FIGS. 11, 12 and 14, if the base current is adjusted beforehand so as to assure the collector current corresponding to the load, a very rapid turn-off operation is accomplished. This is effective especially for the case that a period from turn-on to turn-off is short, because the temporal excessive minority carrier injection into the base region is prevented even in that case. In particularly, according to the fourth feature of the present invention in FIG. 19, in case a plurality of power bipolar transistors connected in parallel are driven, differences in the characteristics of the transistors such as $h_{FE}$, if any, can be compensated to render their characteristics uniform. As a result, thermal instability can be corrected so that safety operation area (SOA) of the circuit can be expanded. In addition, the present invention can entail the above advantage readily by adding the new device without reconstruction of the constituent parts of the conventional circuit, such as the PWM controller. Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
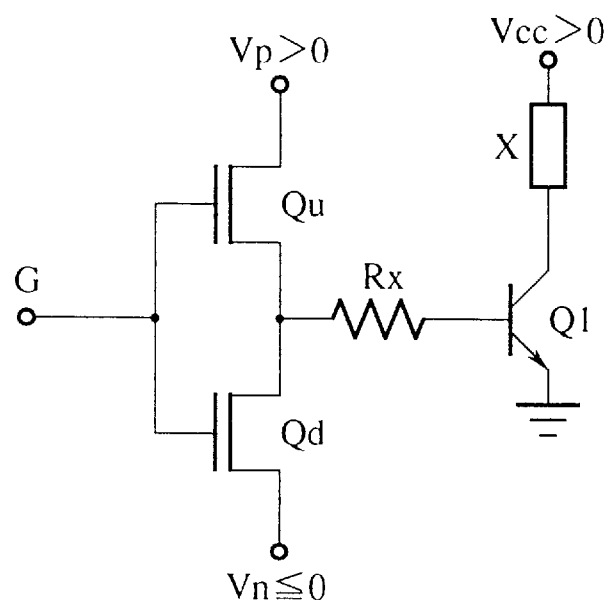
FIG. 1 is a circuit diagram showing a first prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

(First Embodiment)

Figure 4:
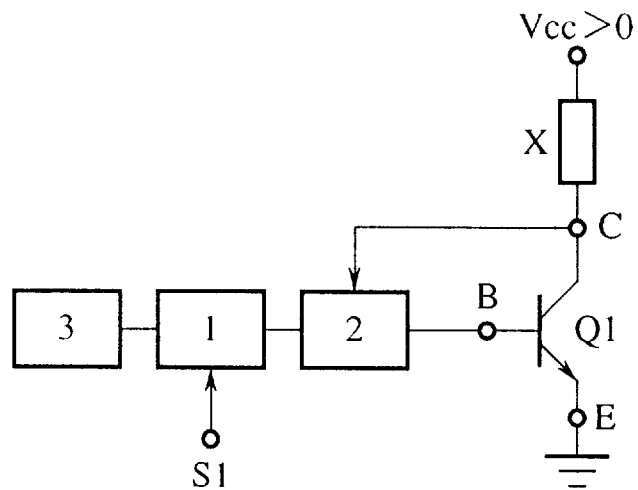
FIG. 4 is a block diagram showing a first embodiment of the present invention.

FIG. 4 is a basic block diagram illustrating a concept according to a first embodiment of the present invention. In FIG. 4, a reference Q1 denotes a power bipolar transistor to be controlled (may be referred simply to as a "transistor" hereinafter). Now an npn bipolar transistor will be explained by way of example. E is an emitter terminal of the transistor Q1, which is connected to ground (=0 V). C is a collector terminal which is connected to a positive voltage source Vcc via a load X. B is a base terminal. In addition, a reference 1 denotes a first controlling device; 2, second controlling device; and 3, power source for supplying a base current. A line connecting these elements shows flow of the base current. In this fashion, the base current output from the power source 3 is supplied to the transistor Q1 via the first controlling device 1 and the second controlling device 2.

The "first controlling device 1" is a controlling device which is used conventionally to drive a current-controlled type transistor. More particularly, the device is composed of the MOSFETs Qu, Qd and a power source Vp, Vn connected thereto in FIG. 1, and it has only functions to receive a signal from an external signal generator and then provide two kinds of signal, i.e., a conduction signal (i.e., positive potential to supply the base current here) and a cut-off signal (i.e., negative or zero potential to extract the current from the base terminal here), to the base terminal B. A signal S1 supplied to the first controlling device 1 signifies a signal which is supplied from an external signal generator (first signal).

The "second controlling device 2" is a controlling device which is interposed in the course of current supplied from the first controlling device 1 to the transistor Q1, and detects conditions of the transistor when at least the transistor Q1 is rendered conductive to thereby adjust appropriately the base current which is supplied from the first controlling device 1 to the transistor Q1. Here "conditions of the transistor Q1" means collector current value, collector voltage value, emitter current value, base current value, base voltage value, temperature, etc.

Figure 5:
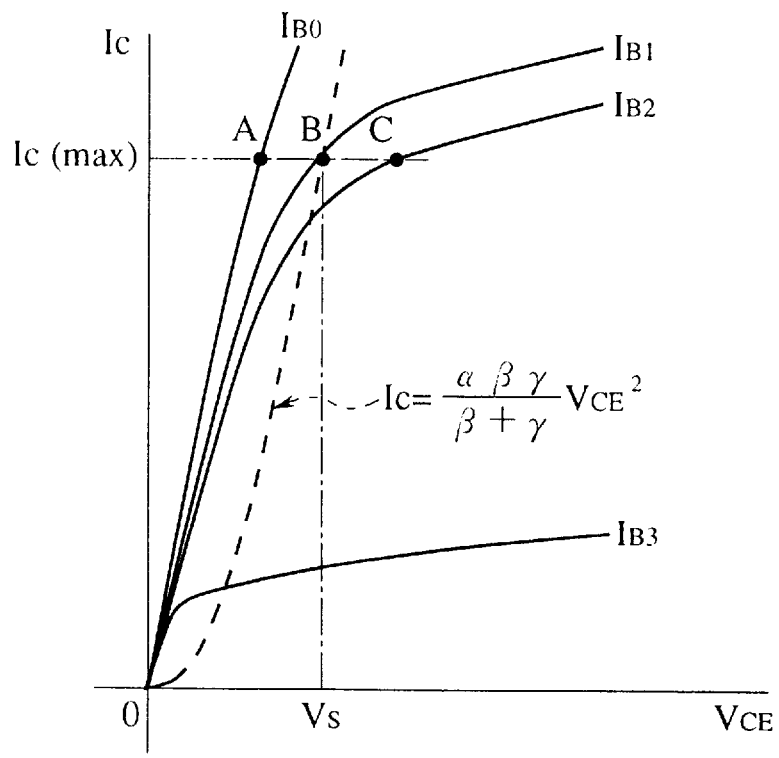
FIG. 5 is a characteristic diagram showing voltage-current characteristic curves of a bipolar transistor.

In this connection, voltage-current characteristics of the bipolar transistor is shown in FIG. 5. In conduction state of the bipolar transistor, if the base current is supplied excessively, an operating point of the transistor is shifted to a so-called "saturation region" wherein the current substantially linearly increases in proportion to the voltage like a point A shown in FIG. 5, and $V_{CE}$ (which means potential difference between the collector terminal C and the emitter terminal E and is referred simply to as "collector potential" hereinafter) is low, and the current may flow with constant loss. Nevertheless, if a so large base current value is applied, $V_{CE}$ cannot be correspondingly reduced to thus render its operation ineffective. Further, minority carriers are present excessively in the transistor Q1 and therefore "storage time", i.e., time required for removing minority carriers, is prolonged in turn-off of the transistor. Consequently, the transistor used within the saturation region yields increased turn-off time to thus lower the switching frequency. In contrast, if the base current is reduced, an operating point of the transistor is shifted to a so-called "active region" (or quasi-saturation region) like a point C in FIG. 5 and in addition switching rate can be accelerated because storage of minority carriers is lessened. However, the drawback will arise that the energy being consumed in the transistor is increased conversely because $V_{CE}$ is increased abruptly, so that the transistor is heated excessively. Therefore, in the next, it is desired that an operating point of the transistor would be controlled to be set near the boundary between the saturation region and the active region (or quasi-saturation region) like a point B in FIG. 5.

Figure 6:
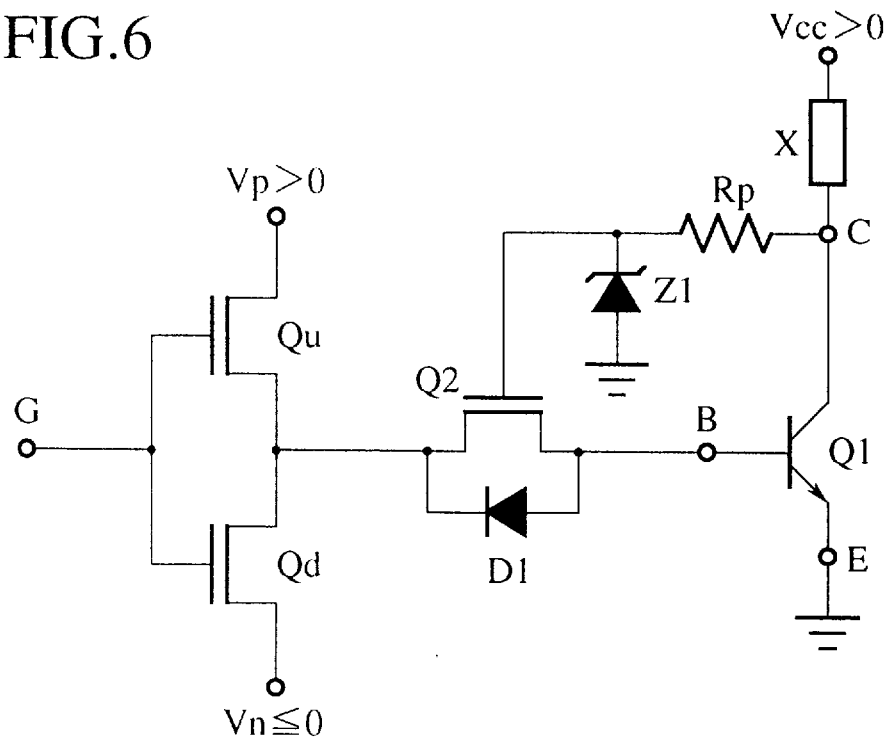
FIG. 6 is a circuit diagram showing a definite configuration according to the first embodiment of the present invention.

FIG. 6 is a circuit diagram illustrating a configuration according to the first embodiment of the present invention more definitely. In this configuration, an example is shown wherein a low breakdown voltage MOSFET (referred to as a "control transistor Q2" hereinafter) is used as the second controlling device 2. The control transistor Q2 is formed of a depletion type n-channel MOSFET, the gate terminal being connected to the collector terminal C of the transistor Q1. D1 is a rectifying diode, and it may be a parasitic diode of the power MOSFET used as the control transistor Q2. It is noted that the control transistor Q2 without the parasitic diode and another diode connected to the control transistor Q2 in parallel may be used together. Although a resistor Rp and a Zener diode Z1 are not directly concerned with the present invention, they are schematically inserted as a mechanism for protecting a gate of the control transistor Q2. Here, Rp has a large resistance such as 1M Ω, and the Zener breakdown voltage of Z1 is about several Volts. More particularly, if the collector potential of the transistor Q1 is about 1 to 2 V, the collector potential is directly transferred to the gate terminal of the control transistor Q2. And, if the collector potential exceeds the breakdown voltage of the Zener diode Z1, the voltage applied to the gate of the control transistor Q2 is clamped at the breakdown voltage of the Zener diode Z1 to thus prevent destruction of the gate of the control transistor Q2. A portion composed of the MOSFETs Qu and Qd corresponds to the first controlling device 1 shown in FIG. 4, and an external signal S1 is supplied to the gate terminal G. Vp correspond to the power source 3 for supplying the base current.

Subsequently, an operation of the circuit in FIG. 6 will be explained hereinbelow. First, in case that the collector potential of the transistor Q1 is about 0.5 V in conduction state, for example, and thereby a channel of the control transistor Q2 is ready to flow a constant base current. Assume now that collector potential is slightly increased because of variation of the load X, the channel of the control transistor Q2 tends to open correspondingly. Hence the much more base current is supplied to the transistor Q1 to thus lower the collector potential. On the contrary, assume that collector potential is slightly decreased because of variation of the load X, the channel of the control transistor Q2 is caused to be closed to thus reduce supply of the base current. This causes increase of the collector potential. In the conduction state, the collector potential of the transistor Q1 is balanced within certain conditions according to such operation of the control transistor Q2.

Next, in the transit of turn-off, if the MOSFET Qd and the MOSFET Qu are rendered conductive and cut-off respectively by the first signal S1 to the gate terminal G of the first controlling device 1 and then they start to extract excessive carriers from the base terminal of the transistor Q1 and extract the base current as a cut-off signal, the base current flows through the control transistor Q2 conversely. Thus if the collector potential of the transistor Q1 begins to increase, the control transistor Q2 changes into more conductive state to accelerate the progress of turn-off. If a rectifying diode D1 is connected in the direction shown in FIG. 6, the base current can be extracted more quickly. In other words, in some cases the value of the main current becomes low according to just preceding conduction state of the transistor Q1, and therefore, like $I_{B3}$ in FIG. 5, the base current is restricted by the channel resistance of the control transistor Q2. During an initial period of turn-off, i.e., "storage time", the current is extracted from the base terminal but the collector potential is scarcely changed. Accordingly, the control transistor Q2 still remains in such state that it is hard to flow the base current during this period, nevertheless the base current can be extracted quickly via the rectifying diode D1 irrespective of the state of the control transistor Q2. Extraction of current from the base terminal of the transistor Q1 is completed in a while, and the collector current is eliminated to shift the transistor Q1 into "cut-off state".

In cut-off state, the collector voltage of the transistor Q1 is at high positive potential Vc. Thus clamped positive potential is applied to the gate terminal of the control transistor Q2 to bring the channel into full open state. Consequently, if the MOSFET Qu in the first controlling device 1 becomes conductive to flow the base current of the transistor Q1 as a conduction signal, the control transistor Q2 in low resistance state transfers the base current to the base terminal of the transistor Q1 to enable quick turn-off. In this manner, the base current can be controlled appropriately according to load condition, etc. in conduction state. At the time of turn-on and turn-off, unlike the control made by the fixed resistor, the switching rate of the transistor Q1 is accelerated, without the distance by the control circuit having fixed resistor.

As previously explained, advantages of the first embodiment of the present invention shown in FIG. 5 are that first the base current corresponding to varying collector current of the transistor Q1 can be supplied appropriately. And secondary, the transistor Q1 does not become saturation state to prevent extension of the turn-off time, as a result. Further, the overheat of the transistors due to shortage of the base current is also prevented. In the first prior art shown in FIG. 1, power is dissipated wastefully in the control circuit by the fixed resistor Rx upon extracting the base current of the transistor Q1. On the contrary, in the first embodiment of the present invention, the power dissipation can be saved during switching operation since the control transistor Q2 becomes low resistance state upon switching so that cooling equipments can be simplified or reduced. Then an operating point of the transistor Q1 on the current-voltage curve will be explained. Since potential of the source terminal of the control transistor Q2 depends on the base-emitter voltage of the transistor Q1 and is varied in virtue of flow of the base current, settled value of the collector potential is varied correspondingly to the collector current. There is a tendency that the value becomes low as the collector current value decreases Simple rough estimate of the above operations will be explained. First the voltage-current characteristic curves of the transistor Q1 are shown in FIG. 5. When the transistor Q1 is in conductive state, the collector potential $V_{CE}$ on the operating point is a relatively low value such as about 0.5 V, for example. If the load X is inductive like coils in the motor, the current flowing through the transistor Q1 assumes a constant value, as shown by dot-dashed line in FIG. 5, regardless of the base current. If the collector current IC is constant, the collector potential $V_{CE}$ becomes high when the base current $I_B$ is small while the collector potential $V_{CE}$ becomes low when the base current $I_B$ is large. This relationship can be expressed approximately by the following equation (1).

$$I_C = \alpha I_B \cdot V_{CE} \tag{1}$$

Where α is a constant. The base current $I_B$ and the base-emitter voltage $V_{BE}$ are related to have a diode characteristic, which can be expressed approximately by the following equation (2).

$$I_B = \beta V_{BE} \tag{2}$$

Where β is a constant corresponding to conductivity. Although the current-voltage characteristic of the control transistor Q2 also has a threshold value at a certain point, it can be expressed approximately by the following equation (3) because the current value is increased when the gate voltage is increased.

$$I_B = \gamma V_{CE} - V_{BE}) \tag{3}$$

Where γ is a constant corresponding to transfer coefficient. If a relation between $V_{CE}$ and $I_c$ is derived by considering these above equations together, it can be expressed by the following equation (4).

$$I_C = \frac{\alpha\beta\gamma}{\beta+\gamma} V_{CE}^2 \tag{4}$$

More particularly, if the transistors Q1 and Q2 having the above characteristics, $V_{CE}$ is settled according to $I_C$ on a point shown by a heavy broken line in FIG. 5. This tendency is substantially similar even if strict equations are applied in place of the above equations (1) to (3) or even if the inductive load is replaced with the resistive load. In other words, a boundary line between the saturation region and the active region (or quasi-saturation region) of the transistor is substantially proportional to the collector potential. Therefore, if $V_{CE}$ is adjusted to settle just on the point B in FIG. 5 when the rated collector current is supplied, for example, the transistor never enters into the excessive saturation region when the collector current assumes any value less than the rated value.

In addition, in the event that the drive circuit according to the first embodiment of the present invention is used as a circuit for driving the power bipolar transistor constituting the PWM inverter and the load X has inductive component such as the coils in the motor, there exist a period where "the transistor Q1 cannot serve actually because of the negative $V_{CE}$ although the on signal is output from the controlling device". In the conventional method, the base current is supplied to the transistor Q1 during this period and used wastefully. However, in the present invention, since the current flowing through the control transistor Q2 is restricted if $V_{CE}$ is less than a predetermined value, the negative $V_{CE}$ causes the control transistor Q2 to cut off the base current. Therefore, if the first controlling device 1 tries to flow the base current during this period, the second controlling device 2 would cut off this base current to thus save power dissipation. Like the above, operation of the second controlling device 2 does not affect operation of the first controlling device 1 which is the controlling device used in the first prior art, and no reconstruction of the device is needed. Therefore, performance of the system can be improved conveniently by simply adding the second controlling device 2 to the circuit of the first controlling device 1. Furthermore, since the base current (gate current) is not subjected to chopper control as in the second prior art, the present invention can be controlled irrespective to characteristics such as carrier lifetime of the transistor to be controlled, and further there is no situation where storage time becomes unstable in turn-off period.

(Variant 1)

Figure 7:
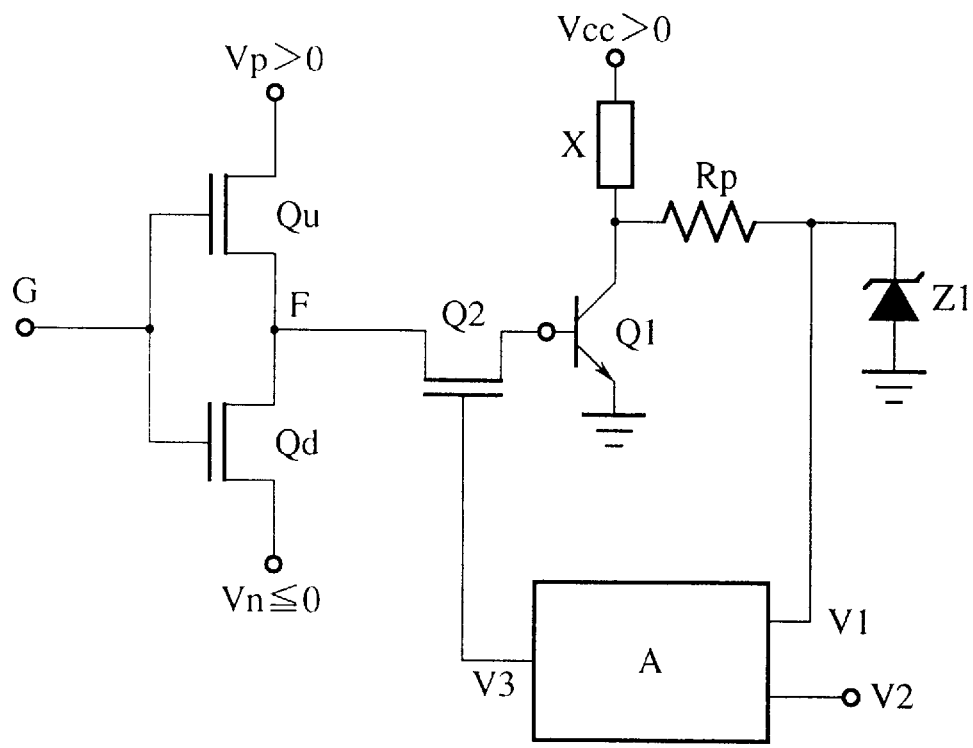
FIG. 7 is a circuit diagram showing another definite configuration according to the first embodiment of the present invention.

FIG. 7 is another circuit diagram showing modified configuration according to the first embodiment of the present invention corresponding to a block diagram shown in FIG. 4. An operational amplifier A is attached to effect the control operation more precisely. More fine and precise control can be effected by adding the operational amplifier A rather than that effected in the circuit in FIG. 6. Though in FIG. 6 the depletion mode MOSFET has been used as the control transistor Q2, usual enhancement mode MOSFET, p type MOSFET, JFET, bipolar transistor or SIT can be used according to this configuration, as the case may be. A collector potential of the transistor Q1 and reference potential are input as V1 and V2 respectively to the operational amplifier A. The collector potential VCE can be set at any value by adjusting the value of V2. If function for detecting the base potential of the transistor Q1 is supplemented to the operational amplifier A to effect fine operation, the collector potential can be fixed constant on the operating point.

Figure 2:
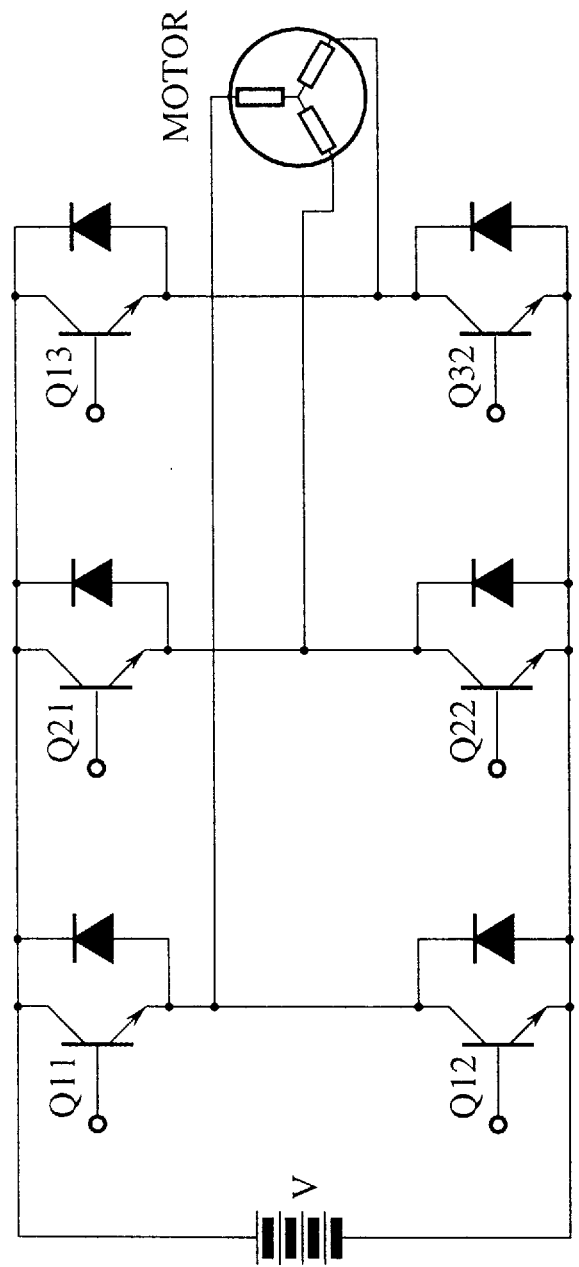
FIG. 2 is a circuit diagram showing a configuration of a PWM inverter.
Figure 3A:
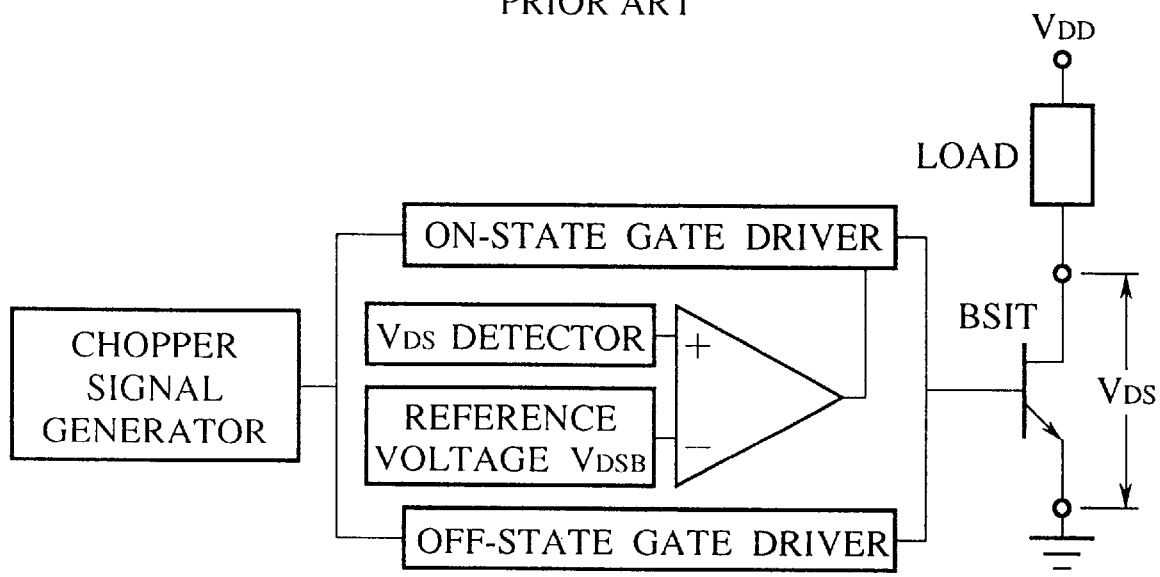
FIG. 3A is a circuit diagram showing a second example in the prior art.
Figure 3B:
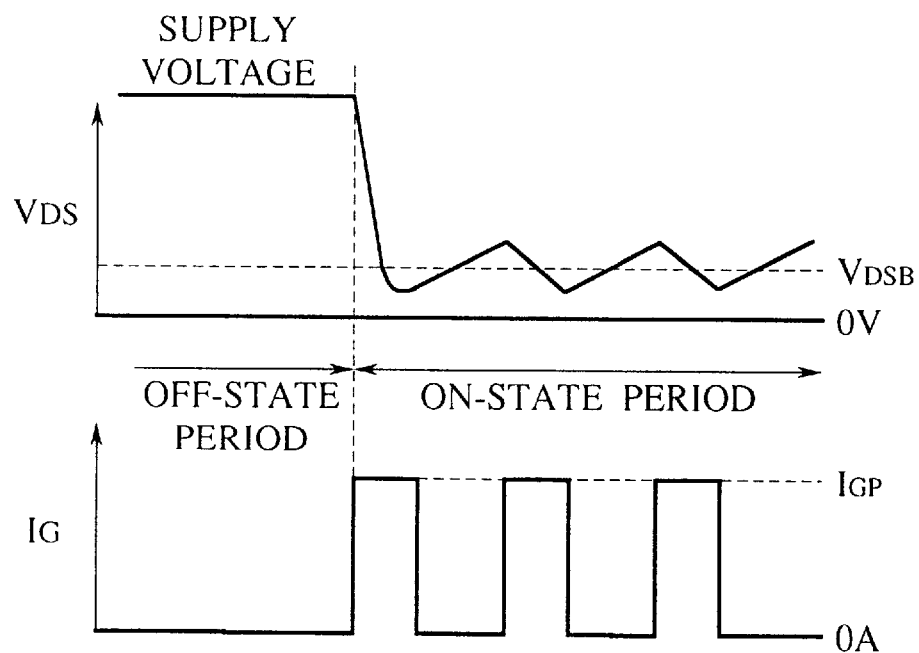
FIG. 3B is a characteristic diagram showing behavior of a gate current in FIG. 3A.

Advantages will be explained roughly when the transistors in the PWM inverter for driving the AC motor in FIG. 2 are driven under the condition where the collector potential is hold at a constant value in on state. The drive circuit according to the first variant of the first embodiment of the present invention shown in FIG. 7 is useful for the power bipolar transistor to control the drive motor in the electric vehicle, for instance. If general travel pattern of the vehicle is examined, the period during which the drive system needs maximum torque, for example, lightening acceleration, steer ascending travel, etc. is relatively rare in the overall travel environment, and torque necessary for most of street travelling is less than ½ of the maximum torque. If the vehicle is travelling at constant speed, the required torque is about ¹⁄₁₀ of the maximum torque at best. In the case of the electric vehicle in which the AC motor is driven by the PWM inverter, since the current flowing into the motor is almost proportional to generated torque of the motor, it is the rare case that the rated collector current flows through the transistors in the PWM inverter mounted on the electric vehicle. In most cases, merely the current being less than ½ of the rated collector current flows.

Assume that positive potential in the control system is 5 V and that the voltage consumed in forward bias between the base-emitter junction of the transistor Q1 is about 1 V, the value of resistor Rx in FIG. 1 must be selected as 0.04 Ω [=(5−1)/100] to flow the base current of 100 A if the resistor-controlled type circuit as shown in FIG. 1 is employed. Since the current of 100 A flows from positive potential of 5 V to grounded emitter terminal of the power bipolar transistor, loss $W_B$ generated by the base current becomes 500 W even though the collector current value assumes either 1000 A or 100 A. In this connection, if the collector current of 1000 A flows to provide $V_{CE}$=0.3 V, generated heat can be suppressed at 0.3 V×1000 A=300 W at maximum. According to the prior method, heat generated from the control system is large rather than conduction loss caused by the main current in the transistor Q1.

Figure 8:
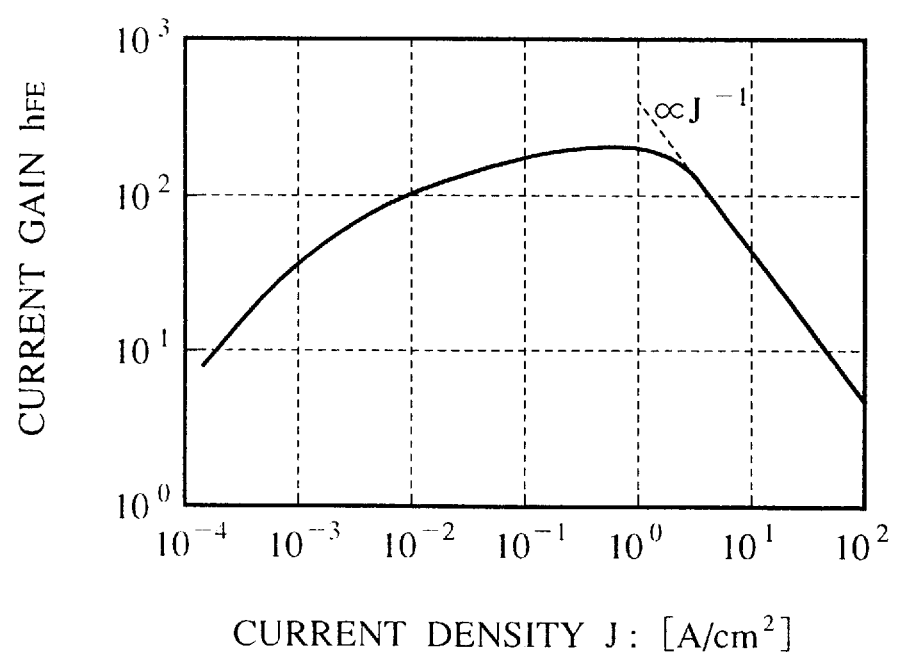
FIG. 8 is a characteristic diagram showing a relationship between a current gain $h_{FE}$ and a collector current density J in the bipolar transistor.

In contrast, based on the control circuit according to the first variant in the first embodiment of the present invention, if the rated collector current of the transistor Q1 corresponding to FIG. 8 is set at 1000 A, the relationship between the base current $I_B$ and the collector current $I_c$ can be expressed by the following equation (5).

$$I_B = 10^{-4} \times I_C^2 \tag{5}$$

Accordingly, the base current is still 100 A and the loss $W_B$ is still 500 W when the rated current of 1000 A flows through the collector, but this is abruptly decreased as the collector current is reduced. For instance, if the collector current is 500 A equal to half of the rated value, the base current required at that time is 25 A and the $W_B$ is only 125 W which is quarter of the above value. In constant street travelling where the collector current being ¹⁄₁₀ of the rated value only flows, heat generated from the control transistor Q2 can be calculated as about 5 W at best. Even in the event that the motor requests the rated current of the transistor, average loss can be suppressed below the half of that generated in the first prior art if the PWM control is effected according to the method of the present invention and also the sinusoidal current is supplied to the motor.

In this fashion, the present invention is capable of suppressing heat generation from the transistors and their control system and also contributing to save of energy and reduction in burden of the equipment in the control system circuit.

(Variant 2)

Figure 9:
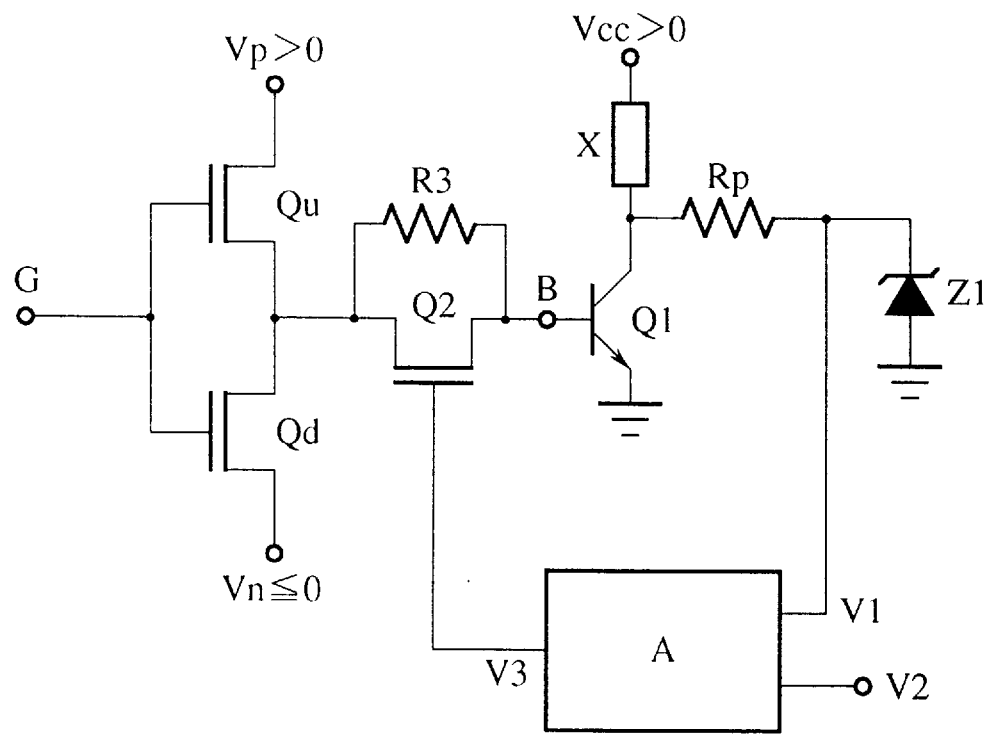
FIG. 9 is a circuit diagram showing still another definite configuration according to the first embodiment of the present invention.

FIG. 9 is a still another circuit diagram showing another modification (second variant) according to the first embodiment of the present invention corresponding to the block diagram shown in FIG. 4.

In the circuit according to the second variant shown in FIG. 9, a resistor R3 having high resistance is connected to the control transistor Q2 in parallel. In the circuit configuration shown in FIG. 6, if the collector current value of the transistor Q1 is low, the gate bias of the control transistor Q2 is close to the threshold value and required base current for the transistor Q1 becomes low, and therefore there is a possibility that the collector current of the transistor Q1 intermittently flows unintentionally due to slight variation of $V_{CE}$. Hence, minimum base current can be assured by the resistor R3 being connected in parallel, to prevent the collector current from flowing intermittently. Assuming that minimum value of the collector current of transistor Q1 is 1/1000 of the rated value, i.e., to ensure the base current of 10 $\mu$A when IC=0.1 A flows in the equation (5), and the Vp is +5 V, for example, the resistance value of the resistor R3 may be set at about 500 k$\Omega$. Of course, special transistor (having a parasitic diode) which may flow a lot of leakage current at the time of cut-off may be used as the control transistor Q2.

(Second Embodiment)

Figure 10:
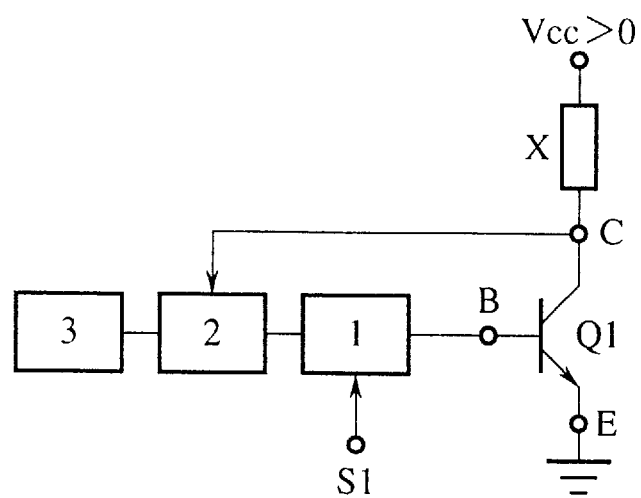
FIG. 10 is a block diagram showing a second embodiment of the present invention.
Figure 11:
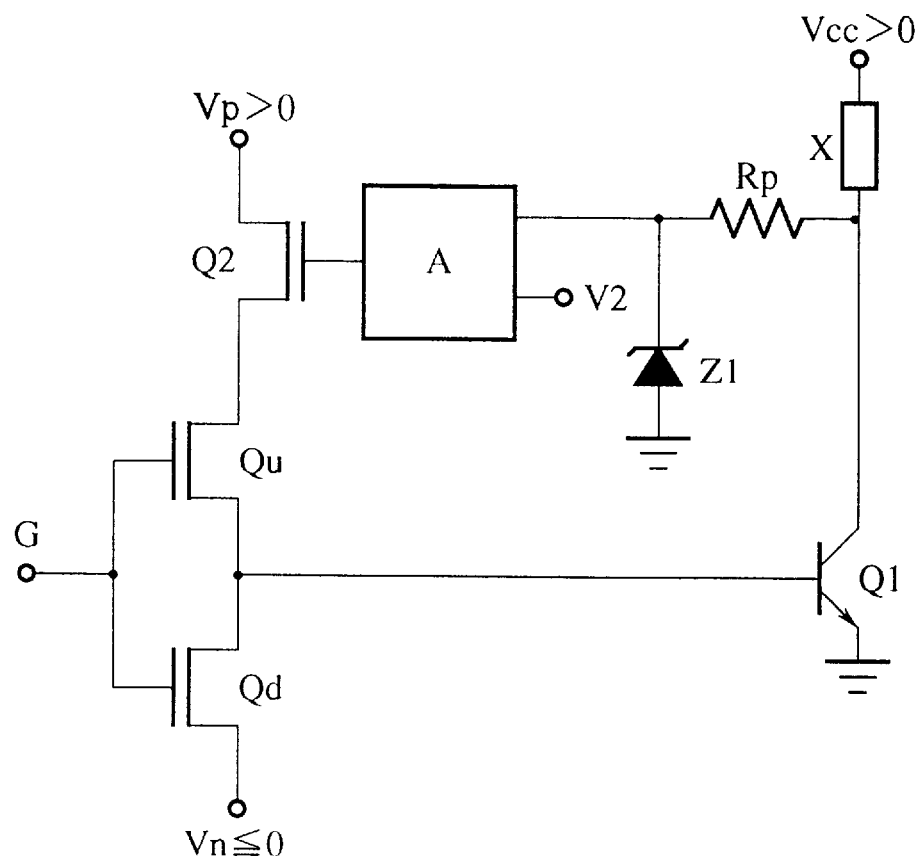
FIG. 11 is a circuit diagram showing a definite configuration according to the second embodiment of the present invention.

FIG. 10 is a basic block diagram showing a concept of a second embodiment of the present invention, and FIG. 11 is a more definite configuration of the block diagram shown in FIG. 10. In FIG. 10, a reference Q1 denotes a power bipolar transistor to be controlled. Now an npn bipolar transistor will be explained for purposes of example. E is an emitter terminal of the transistor Q1, which is grounded (=0 V). C is a collector terminal which is connected to a positive voltage source Vcc via a load X. B is a base terminal. In addition, a reference 1 denotes a first controlling device; 2 denotes second controlling device; and 3 denotes power source for supplying a base current. A line connecting these elements shows flow of the base current. In this manner, the base current output from the power source 3 is supplied to the transistor Q1 via the second controlling device 2 and the first controlling device 1. In the second embodiment of the present invention, the first controlling device 1 and the second controlling device 2 is connected in the opposite order to that in the first embodiment shown in FIG. 4.

The "first controlling device 1" corresponds to a controlling device shown in FIG. 1 which is used conventionally to drive a current-controlled type transistor such as the bipolar transistor Q1. In particular, the device is composed of the MOSFETs Qu, Qd and power sources Vp, Vn connected thereto in FIG. 11, and it has only functions to receive a signal S1 from an external signal generator to the gate G and then provide two kinds of signal, i.e., a conduction signal (i.e., positive potential to supply the base current here) and a cut-off signal (i.e., negative or zero potential to extract the current from the base terminal here), to the base terminal B of the transistor Q1. The "second controlling device 2" is a controlling device which is interposed in the course of current supplied from the power source 3 to the first controlling device 1, and detects a condition of the transistor when at least the transistor Q1 is rendered conductive to thereby adjust appropriately the base current which is supplied from the first controlling device 1 to the transistor Q1. Here "a condition of the transistor Q1" means collector current value, collector voltage value, emitter current value, emitter voltage value, base current value, base voltage value, temperature, etc. In FIG. 11, the second controlling device 2 is composed of the control transistor (MOSFET) Q2 and the operational amplifier A.

The collector potential of the transistor Q1 is input to the operational amplifier A as V1 via the resistor Rp. The reference potential is input into the operational amplifier A as V2, and any collector potential $V_{CE}$ may be set by adjusting the value of V2. If function for detecting the base potential of the transistor Q1 is supplemented to the operational amplifier A to effect fine operation, the collector potential can be fixed constant on the operating point. The depletion mode MOSFET or enhancement mode MOSFET may be used as the control transistor Q2, and p type MOSFET, JFET, bipolar transistor or SIT can be used as the case may be.

With the above configuration shown in FIG. 10 or 11, the base current can be controlled by the control transistor Q2 like the first embodiment of the present invention when the transistor Q1 is conducted. However, since the current extracted from the base terminal flows without passing through the control transistor Q2 when the transistor Q1 is turned off, quick turn-off can be attained even if a diode is not connected to the control transistor Q2 in parallel or if a transistor without such parasitic diode is used.

(Third Embodiment)

Figure 12:
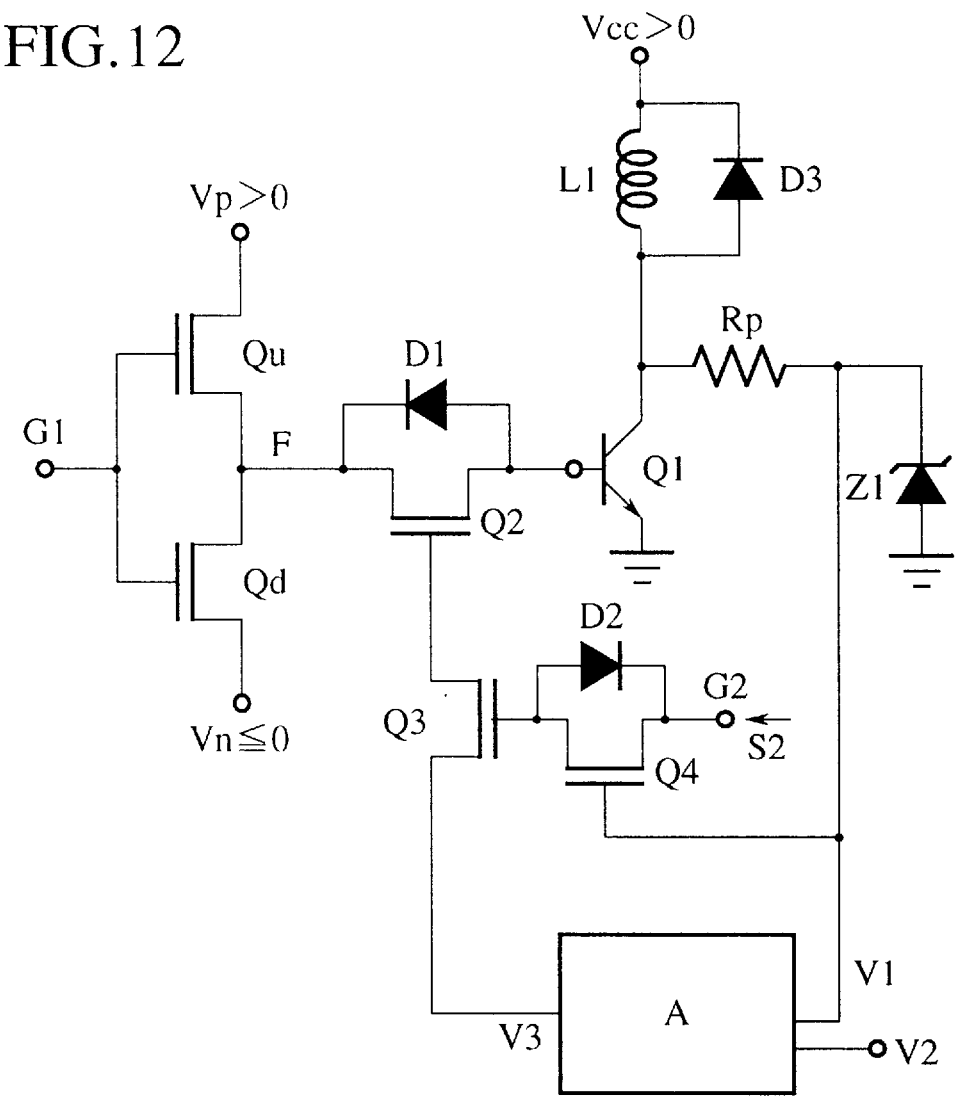
FIG. 12 is a circuit diagram showing a third embodiment of the present invention.

FIG. 12 is a circuit diagram showing a third embodiment of the present invention. In the configurations according to the first and second embodiments previously explained, the control transistor Q2 is in its full open state at the time of turn-on so as to supply the base current to the transistor Q1 quickly. However, excessive base current would be supplied at an initial stage of turn-on, so that it takes a lot of time to release the transistor Q1 from its saturation region in the event that turn-off is caused immediately after turn-on because of the short conductive period. It is supposed that such situation becomes dominant particularly if the collector current value required is low. In order to compensate for such situation, in the circuit in FIG. 12, the control transistors (MOSFETs) Q3 and Q4 are attached to the configuration in FIG. 7 according to the first embodiment.

A detailed configuration will be explained. A control transistor Q3 is interposed between the gate terminal of the control transistor Q2 and the an gate terminal of the operational amplifier A. A gate terminal of a control transistor Q3 is connected to a terminal G2 via a depletion mode p-channel MOSFET Q4. A second external signal S2 is input into the terminal G2. The MOSFET Q4 has a parasitic diode (or a leakage current component) D2 in the direction shown in FIG. 12. A control terminal of the MOSFET Q4 is connected to the collector of the transistor Q1 via the resistor Rp, and is constructed to cooperate with the transistor Q1 when the collector potential is at low potential.

Figure 13:
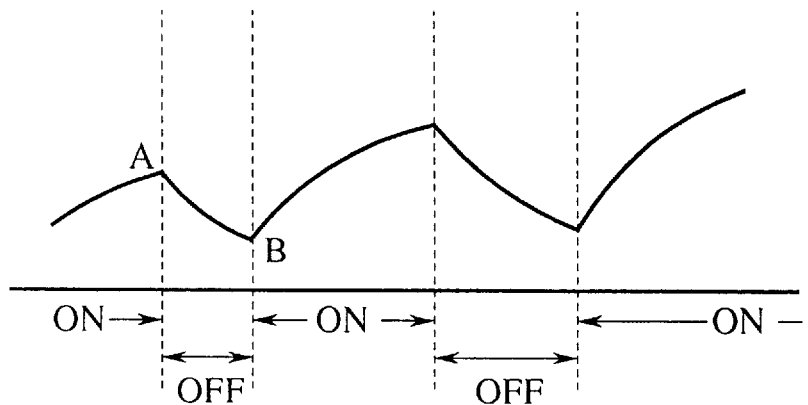
FIG. 13 is a characteristic diagram showing behavior of current flowing through a load when a transistor effects switching of an inductive load.

Next, behavior of the current flowing through the load will be discussed before an operation of the circuit is explained. The transistor Q1 is connected to the load consisting of a coil L1 and a diode D3, as shown in FIG. 12, and drives the inductive load. Where the coil L1 may be considered to represent the DC motor or AC motor in the equivalent form. While FIG. 13 illustrates behavior of the current flowing through the coil L1 which is the load in the circuit in FIG. 12. In other words, in FIG. 13, a period labelled by "ON" is a "conductive" period of the transistor Q1 during when the current which is supplied from the power 30 source to flow through the load is gradually increased. A period labelled by "OFF" is a "cut-off" period of the transistor Q1 during when the current flowing through the coil L1 is fed back through the diode D3. The current value is gradually lowered by internal resistances in the circuit.

Based on the above explanations, an operation in FIG. 12 will be explained. When the first controlling device 1 is in "conductive" state, i.e., the MOSFET Qu is in conductive state, other MOSFETs Q2, Q3, Q4 are in "conductive" state. If the transistor Q1 keeps its conductive state, the collector current value gradually increases owing to nature of the inductive load. Suppose that the gate terminal G1 of the first controlling device 1 receives a first external signal S1 (turn-off signal S1) at the time when the current value reaches a point A in FIG. 13, and the MOSFET Qd starts to conduct and then "the first controlling device 1" starts to transfer to the cutoff state. At this time, by a "second external signal S2" which has similar behavior to that of the first external signal S1, potential of the control terminal of the control transistor Q3 shifts simultaneously from positive to negative to cut off the control transistor Q3. The control transistor Q3 is cut off irrespective of state of the control transistor Q4, because charges are extracted from the gate of the control transistor Q3 via the parasitic diode D2 of the control transistor Q4 to cut off the control transistor Q3. Thus since charges accumulated in the gate of the control transistor Q2 is kept, resistance value between main terminals of the control transistor Q2 is substantially fixed. In the turn-off operation of transistor Q1, excessive carriers stored in the base of the transistor Q1 are extracted mainly via the parasitic diode D1 of the control transistor Q2, there is no trouble even if the resistance value of the control transistor Q2 is high. Then the collector potential of the transistor Q1 begins to raise in a while, and the control terminal of the control transistor Q4 becomes positive high potential cutting off the MOSFET Q4, and finally the transistor Q1 becomes in a cut-off state.

Next, the turn-on operation of transistor Q1 will be explained. When the first controlling device 1 is transferred to "conduction" state by the first external signal S1 (turn-on signal S1), the transistor Q2 supplies the base current via the relatively high resistance value substantially similar to previous one. Therefore, the transistor Q1 is in no ways brought into saturation region. And, the state of the transistor Q2 fixed in the relatively high resistance state has to be maintained until the collector potential of the transistor Q1 falls down near the operating point. Hence, the control transistor Q4 is provided not to conduct the control transistor Q3 actually until the collector potential falls down below the predetermined value near the operation point even when the second signal S2 for driving the control transistor Q3 is supplied as a "conduction" signal. In other words, the control transistor Q4 becomes "conductive" state at first when the collector potential falls down sufficiently below the predetermined value, then the gate of the control transistor Q3 can receive the signal and the control transistor Q2 can be subjected to control by the operational amplifier A.

The first external signal S1 for driving the "first controlling device" may also be used as the second external signal S2. The potential of the output terminal in the first controlling device 1 shown by a reference F in FIG. 12 may also be used as the second external signal S2. Further, for example, the collector voltage may be used to control the base current. For example, in the case of a discrete transistor the range of the collector voltage is less than 1 V at best. Therefore, the control transistor Q4 may be driven by using a trigger signal employing a predetermined value, which corresponds to the collector voltage exceeding several V. If the first controlling device 1 shifts to cut-off state, the direction of the base current may be inverted immediately. Hence, the inversion of the base current may be used as the trigger signal by detecting such inversion by a current detector or the like.

In the configuration in FIG. 12, in the event that the inductive load such as the motor in FIG. 2, for example, is driven, the current to be supplied at first has a magnitude indicated by a point B in FIG. 13 when the transistor Q1 is just turned on. This current is always lower than the value at a point A, i.e., the value corresponding just before the previous turn-off transition. Therefore, in turn on, the current which is slightly higher than the necessary base current is supplied. And the current is not such current close to the maximum current explained in the first or second embodiment of the present invention but appropriate current having relatively low value, the transistor 1 does never enter into excessive saturation region upon turn on. By the third embodiment of the present invention, the base current having a magnitude just enough to accelerate turn on is supplied. Therefore, storage time is in no ways increased upon turn off.

(Fourth Embodiment)

Figure 14:
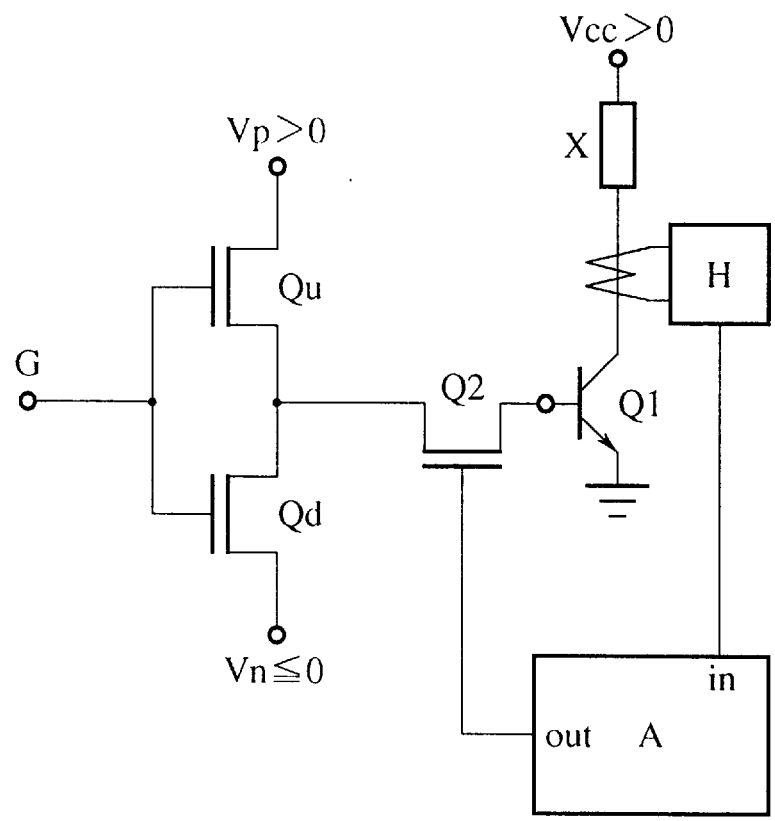
FIG. 14 is a circuit diagram showing a fourth embodiment of the present invention.

FIG. 14 is a circuit diagram showing a fourth embodiment of the present invention. In FIG. 14, H is a current detector for detecting the collector current, which employs a current detecting device as a coil or a Hall element, for example. The collector current value is used here as a condition of the transistor Q1. The current may be detected from the emitter terminal. The above configuration is effective to control the transistor having a characteristic such that the current value significantly changes by a difference between collector-emitter voltage. An operational amplifier A is designed and adjusted beforehand to flow the appropriate base current corresponding to the collector current value of the transistor Q1. The mechanism is that, for example, the base current is calculated based on the equation (5) set forth above, and a control signal is output from the operational amplifier A to the control transistor Q2 to effect the base current. For instance, if the relation of collector current vs. base current at room temperature is measured and the relation is set to the operational amplifier beforehand, the base current is determined by detecting only the collector current value, and the transistor Q1 may shift to saturation region but it is never overheated by great increase of the collector potential due to shortage of the base current. This is because the current amplification factor increases as the temperature increases.

Figure 15:
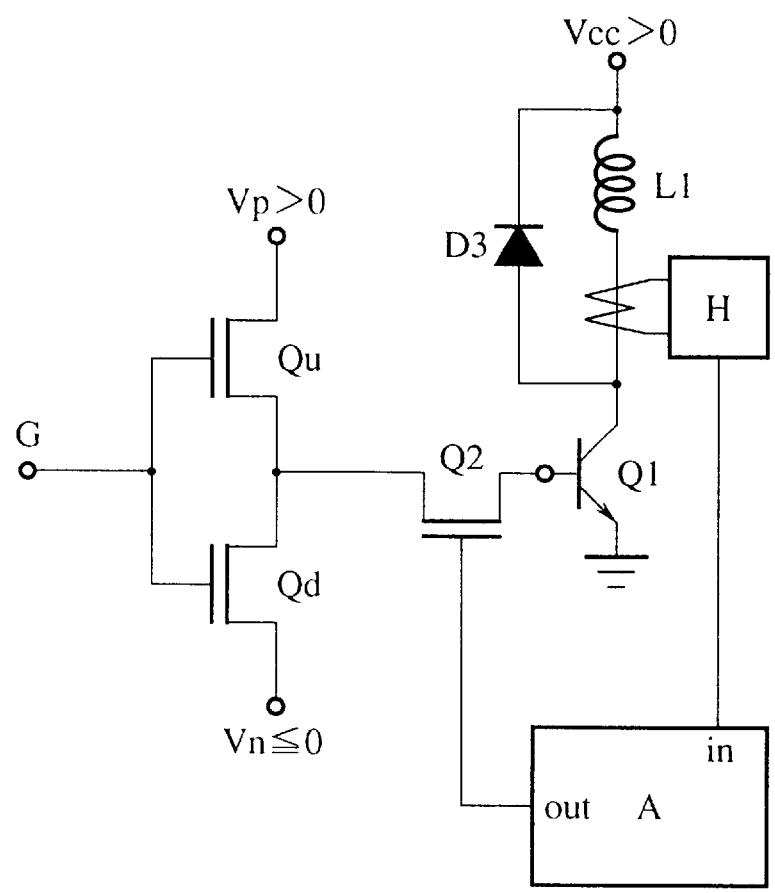
FIG. 15 is another circuit diagram showing the fourth embodiment of the present invention.

But this configuration controls the base current such that the control transistor Q2 flows the base current with low channel resistance when the collector current is large. The control transistor operates such that it does not flow so much base current when the collector current is small, or very small base current flows corresponding to the collector current. Accordingly, when the power transistor Q1 shifts from cut-off state to conduction state, the base current would be small value corresponding to cut off state, from the start. This can be avoided to assure the minimum value of the base current by the bypass resistor R3 as shown in FIG. 9, for example. By the way, a following more effective and simple method for assuring the minimum value of the base current can be employed when the power transistor Q1 drives the load consisting of an inductive load and a rectifier diode, for instance. That is, the method is to detect the value of current flowing through the inductive load like the circuit configuration shown in FIG. 15. Here the inductive load represents DC motor or AC motor in the equivalent form. Such current detection is not so difficult. By way of example, if the transistor Q1 corresponds to the transistor Q11 or Q14 in the PWM inverter (as shown in FIG. 2), the current value flowing through an output line to the motor will be detected. Behavior of the current flowing through the load in the circuit in FIG. 15 is analogous to that in FIG. 13. More particularly, in FIG. 13, a period labelled by "ON" is a "conductive" period of the transistor Q1 during when the collector current which is supplied from the power source $V_{cc}$ to flow through the load is gradually increased. The current detector H is detecting the collector current value of the transistor Q1 during this period. A period labelled by "OFF" is a "cut-off" period of the transistor Q1 during when the current flowing through the coil L1 is fed back through the diode D3. The current value is gradually lowered by internal resistances in the circuit. The current detector H is detecting the feed-back current via the diode. The current value on the point B in FIG. 13 indicates a current value obtained when the transistor Q1 shifts from "cut-off state" to "conduction state". In the configuration in FIG. 15, since the current detector H can detect the collector current value to be flown through the transistor Q1 immediately after turn-on of the transistor Q1, the second controlling device 2 (or MOSFET Q2) can control the base current value based on the detected collector current value. As a result, quick turn-on can be achieved. However, in this method, since the current to be detected flows in the positive direction even under the condition that $V_{CE}$ becomes negative, the transistor Q2 passes the base current and therefore the base current cannot be saved during the negative $V_{CE}$ period as it is.

(Fifth Embodiment)

Figure 16:
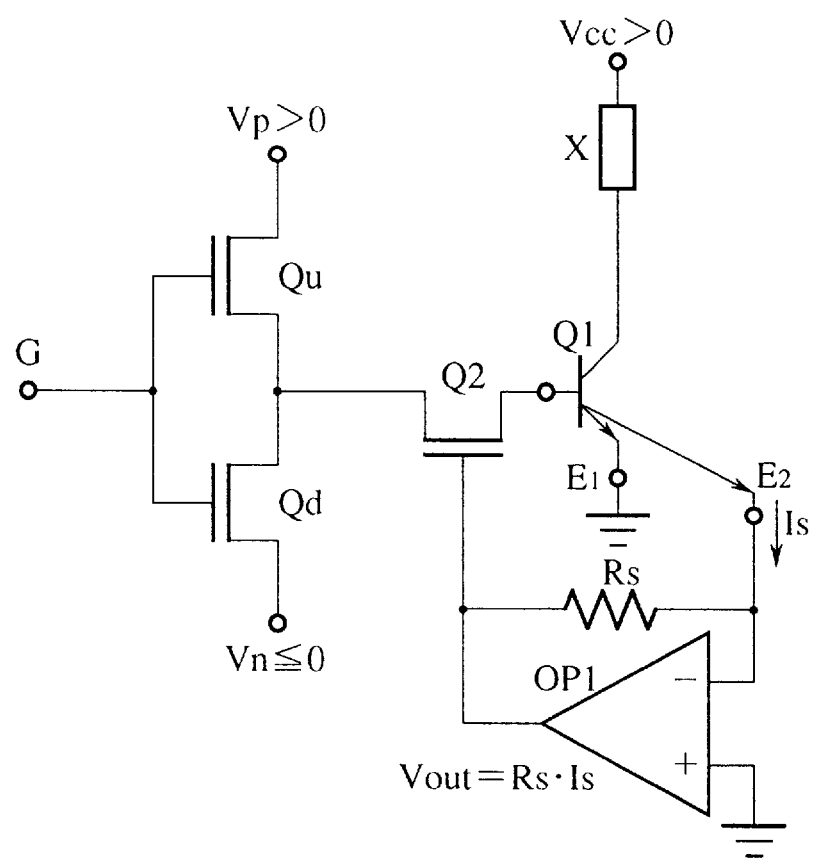
FIG. 16 is a circuit diagram showing a fifth embodiment of the present invention.

FIG. 16 is a circuit diagram showing a fifth embodiment of the present invention. In this circuit, a multi-emitter transistor having two kinds of emitter terminals E1, E2 is used as the transistor Q1, which is a so-called transistor having sense terminal. That is, a second emitter terminal E2 has a similar device structure to that of the main transistor having a first emitter terminal E1, but having an 1/10000 area of the main transistor, for example, is formed as another terminal. Therefore, if the current of 1000 A flows through the first emitter terminal E1, the current of 0.1 A flows through the second emitter terminal E2 proportionally. The control transistor Q2 can be adjusted by the current value through the second emitter terminal E2 by means of a current detecting circuit such as an operational amplifier shown in FIG. 16, for example.

Such structure employs somewhat special transistor as the transistor Q1, but it can respond quickly than the method in FIG. 14 which detects the collector current value as state of the transistor Q1.

(Sixth Embodiment)

Figure 17:
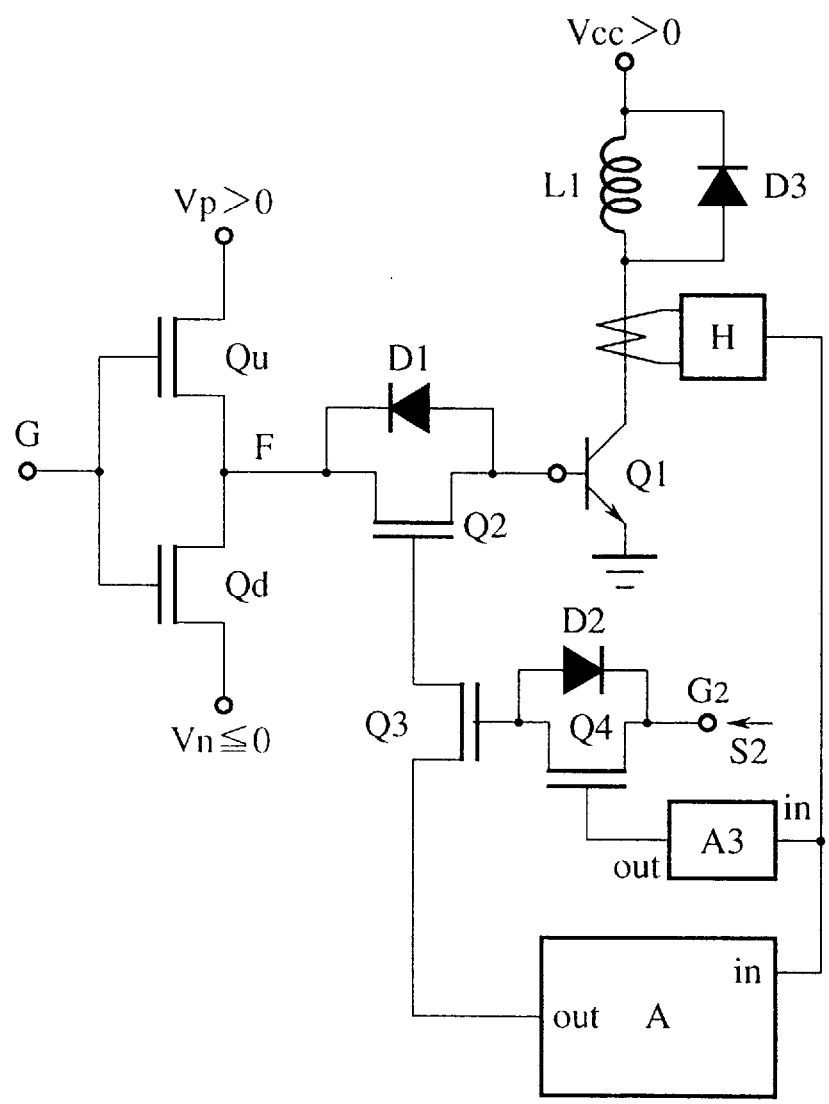
FIG. 17 is a circuit diagram showing a sixth embodiment of the present invention.

FIG. 17 is a circuit diagram showing a sixth embodiment of the present invention. In this circuit, a second external signal S2 is detected by an operational amplifier A3 to change the contents of control. In FIG. 17, in a similar manner to that in FIG. 14, the operational amplifier A3 outputs a signal to a control terminal of the control transistor Q2 (via the control transistor Q3) so as to flow appropriate base current correspondingly to the collector current of the transistor Q1. When the first controlling device 1 consisting of the MOSFETs Qu and Qd is in "conductive" state, other control transistors Q2, Q3, Q4 are also in conductive state. Behavior of the current flowing through the load is similar as shown in FIG. 13. Assume that the first controlling device 1 receives the first external signal S1 to start its transfer to the cut-off state at the time when the current value resides in the point A shown in FIG. 13. At this time, by the second external signal S2 (e.g., potential of the output terminal F of the first controlling device 1) which has similar behavior to that of the first external signal S1, potential of the control terminal of the control transistor Q3 shifts from positive to negative so as to cut off the control transistor Q3. At this time, irrespective of state of the control transistor Q4, and charges are extracted from the gate of the control transistor Q3 via the parasitic diode D2 so as to cut off the control transistor Q3. Thus, since charges accumulated in the gate of the control transistor Q2 is kept, the relatively high resistance value between main terminals of the control transistor Q2 is substantially fixed. Because excessive carriers remaining in the base of the transistor Q1 are extracted mainly via the parasitic diode D1 of the control transistor Q2, there is no trouble even if the resistance value of the control transistor Q2 is high. The collector potential of the 10 transistor Q1 begins to fall down in a while, then the control transistor Q4 is cut off in virtue of operation of the operational amplifier A3.

Figure 18:
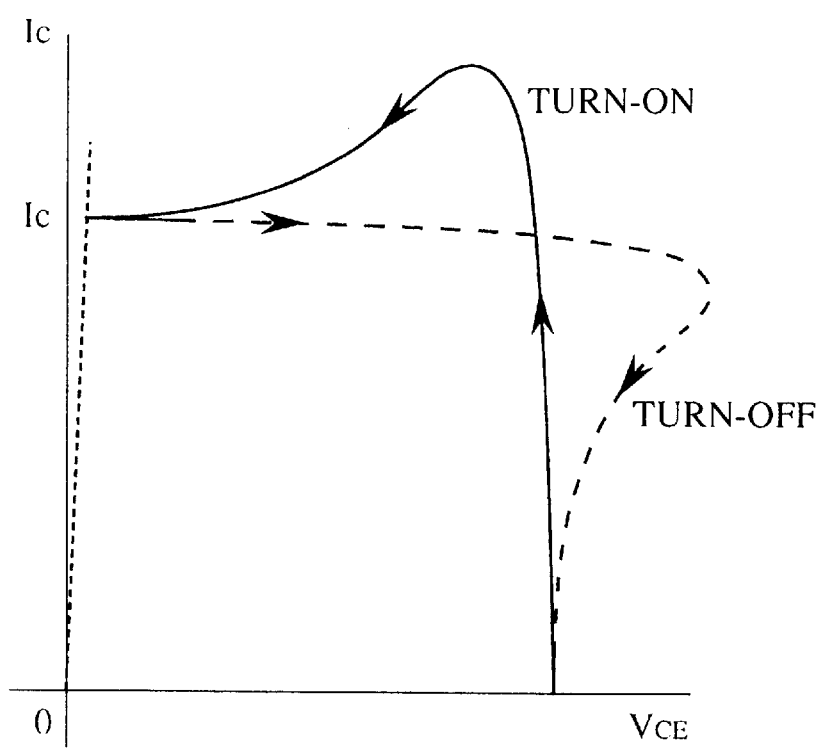
FIG. 18 is a characteristic diagram showing current-voltage behavior of a collector terminal when being switched if a transistor drives a coil having a free wheeling diode in the sixth embodiment.

Then, when the first controlling device 1 is transferred to "conduction" state by the first external signal S1, the MOSFET Q2 supplies the base current via the relatively high resistance value substantially similar to previous one. Therefore, the transistor Q1 is turned on without injecting excess carriers into the base region and it is in no means brought into saturation region. Besides, if the transistor Q1 is turned on, the current-voltage curve traces a locus indicated by the solid line with arrows in FIG. 18. In other words, the current value raises upwardly from cut-off state with the collector voltage being constant as it is and then assumes a maximal value. After this, the collector potential abruptly falls down and thus the current value shifts to an operating point taken in conduction state while settling to a constant value. The maximal value of the solid line is due to reverse recovery current which flows through the diode D3 by the turn-on of the transistor Q1. Cut-off state of the transistor Q3, i.e., high resistance state of the control transistor Q2, must be released at any rate. This can be done by causing the transistor Q3 to be conduction state when the operational amplifier A3 detects the maximal value of the collector current in terms of differential operation, or the like.

(Seventh Embodiment)

Figure 19:
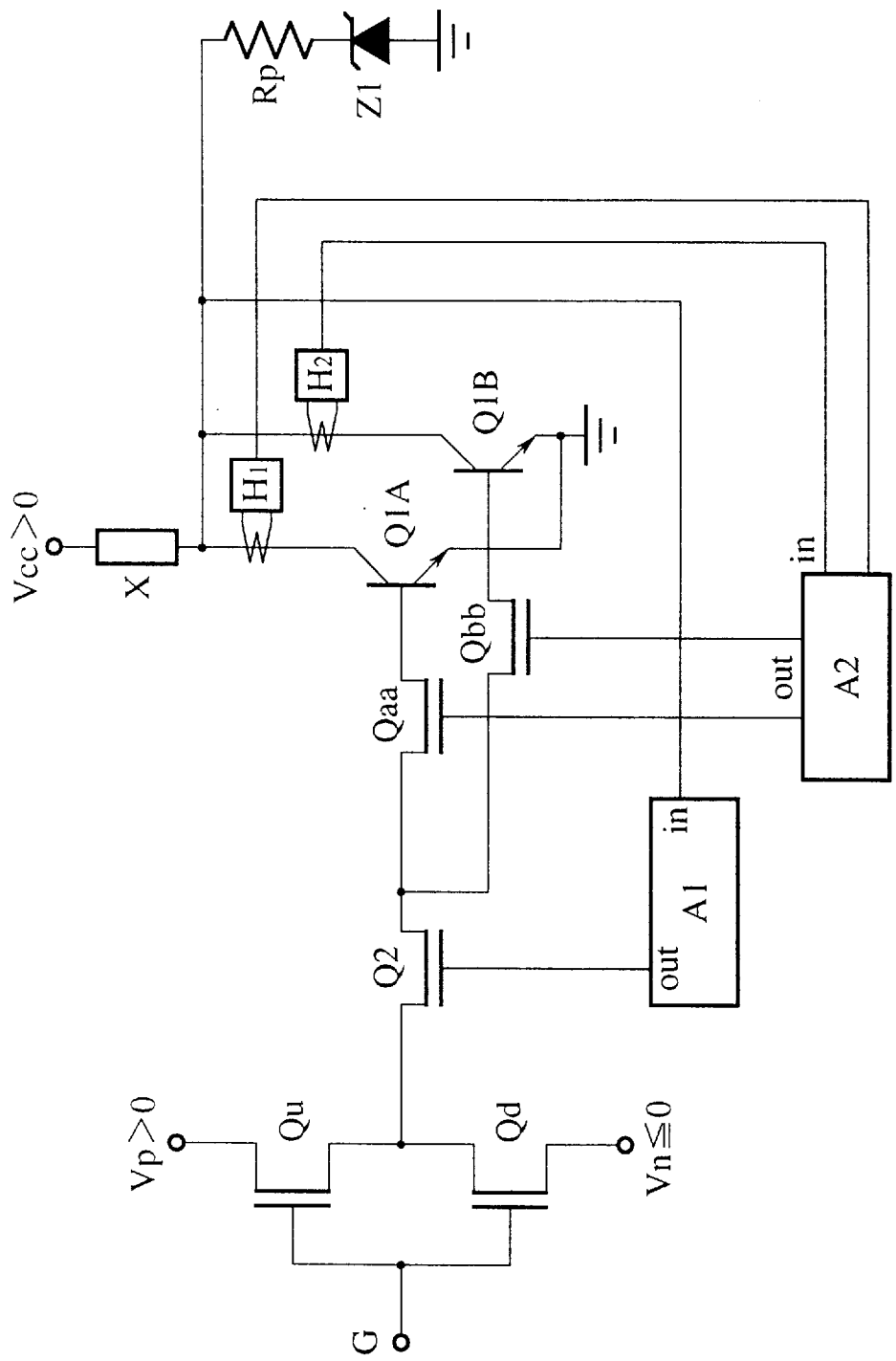
FIG. 19 is a circuit diagram showing a seventh embodiment of the present invention.

FIG. 19 is a circuit diagram showing a seventh embodiment of the present invention. A plurality of transistor chips may be connected in parallel and driven to obtain the large maximum current handling capability such as a power module. Or a plurality of transistor units are formed in parallel on a semiconductor chip. For obtaining a large power handling capability, a circuit for making the current in respective chips (or transistor units) uniform in response to variation in characteristics of respective chips (or transistor units) is important and FIG. 19 shows the circuit according to the seventh embodiment of the present invention. As the feature of the bipolar transistor, current amplification factor $h_{FE}$ is increased with increase in temperature. Therefore, in case a plurality of bipolar transistors or sub-transistors Q1A, Q1B, . . . , each having sub-emitter, sub-collector and sub-base, are in parallel driven, the chip is heated if respective transistor chips have significant characteristic differences, large current flows concentratedly through only one chip. As a result, the current concentrates readily to the specific chip more and more to therefore enhance unevenness of the current values. Such problem can be prevented by the circuit according to the seventh embodiment of the present invention.

The case will be exemplified here where two transistor chips, where two sub-collector terminals are connected to the common collector terminal and two sub-emitter terminals are connected to the common emitter terminal, are driven in parallel. As shown in FIG. 19, respective sub-collector terminals and sub-emitter terminals of transistors Q1A and Q1B are connected together respectively. The transistors Q1A and Q1B are controlled by the first controlling device (MOSFETs Qu, Qd) and the second controlling device comprising the first control transistor (MOSFET Q2) and plural fine control transistors (MOSFETs Qaa, Qbb, . . . ). In detail, the transistors Q1A and Q1B are under the control of the first controlling device 1 and the first control transistor Q2 in common, but the base currents thereof are controlled by the fine control transistors or the second control transistors Qaa and Qbb independently. In FIG. 19, the number of the second control transistor is same as the number of power bipolar transistors, and each power bipolar transistor is controlled by each second control transistor. However, the system can function even if, the second control transistor Qbb, for instance, is omitted. At this case, the base current for Q1B would be fixed by the condition of Q2 and Qaa. Namely, to manage N of power bipolar transistors in parallel with this system, at least, N−1 of second control transistors are needed. Of course, it is preferable to use N of second control transistors for fine control. Like the circuit in FIG. 7, the first control transistor Q2 is controlled by the operational amplifier A1 in compliance with the collector potential. The fine control transistors (second control transistors) Qaa and Qbb are controlled by the operational amplifier A2 which serves to detect collector current values of two transistors Q1A and Q1B respectively, then compare them, and then make both collector current values uniform by restricting the larger base current. As in the circuit in FIG. 7, the first control transistor Q2 changes its resistance value according to switching operation and the variation in the collector potential of the transistor. On the contrary, the second control transistors Qaa and Qbb does not operate during the switching transition, and acts in the conduction state to eliminate difference in the collector current values flowing through two sub-transistors Q1A and Q1B. More particularly, though normally the second control transistors Qaa and Qbb are in their full open state, the second control transistors Qaa increases its resistance value gradually to decrease the base current so as to flow equal currents through respective sub-transistors if the collector current of the sub-transistor Q1A shows the tendency to increase. An operation of the operational amplifier A2 may be relatively slow. Because difference in the collector current between two transistors becomes an issue only when the current value is high, only peak values of the current value may be calculated by the operational amplifier A2. Otherwise the operation for uniformalization may be effected by the operational amplifier A2 only when the collector values in excess of a predetermined value are flown. In such case, the operational amplifier A2 does not operate when the collector values is less than the predetermined value. Or the results of immediately previous operation may be stored in the operational amplifier A2. According to such configuration, current values flowing through a plurality of power bipolar transistors are made uniform and unevenness of heat generated from the chips can be suppressed, so that a safe operation area (SOA) of the overall circuit can be expanded.

Various modifications will become possible for those skilled in the art after receiving the teaching of the present disclosure without departing from the scope thereof.

What is claimed is:

1. A controller for a power bipolar transistor which has at least an emitter terminal and a collector terminal to flow a main current and a base terminal to accept a base current, said controller comprising:
   (a) a first controlling device to give said base current two states that are a "conduction" state or a "cut-off" state in response to a first signal applied from external; and
   (b) a second controlling device including at least a detecting means to detect a potential difference between said emitter and collector terminals, and
   a base-current-control transistor which has two main terminals to transfer said base current, and a control terminal for varying a value of resistance between said two main terminals to manage a condition of said power bipolar transistor within a predetermined range in response to a result of detection of said detecting means, wherein
   said second controlling device operates independently of said first controlling device.

2. The controller as set forth in claim 1, wherein said second controlling device has further functions comprising:
   function to accept a second signal bringing an information about a change of the states of said power bipolar transistor;
   function to fix said resistance between said two main terminal of said base-current-control transistor when said second controlling device detects the change that the state of said power bipolar transistor begins to change from said "conduction" state to said "cut-off" state by said second signal; and
   function to release said fixed-mode of said resistance when said detecting means detects both the moment that the state of said power bipolar transistor changes from said "cut-off" state to said "conduction" state by said second signal and the moment that said potential difference between said collector terminal and said emitter terminal becomes less than a predetermined value.

3. The controller as set forth in claim 2, wherein said second signal is said potential difference between said collector terminal and said emitter terminal.

4. The controller as set forth in claim 2, wherein said second signal is a signal triggered by the change of the direction of said base current.

5. A controller for a power bipolar transistor which has at least an emitter terminal and a collector terminal to flow a main current and a base terminal to accept a base current said controller comprising:
   (a) a first controlling device to give said base current two states that are a "conduction" state or a "cut-off" state in response to a first signal applied from external; and
   (b) a second controlling device including at least a detecting means to detect a current value passing between said collector terminal and said emitter terminal, and
   a base-current-control transistor which has two main terminals to transfer said base current, and a control terminal for varying a value of resistance between said two main terminals to manage a condition of said power bipolar transistor within a predetermined range in response to a result of detection of said detecting means,
   wherein said second controlling device operates independently of said first controlling device.

6. The controller as set forth in claim 5, wherein one of said first controlling device has an current input terminal to accept said base current from an external current source, and one of said main terminals of said base-current-control transistor is connected to said current input terminal, and the other of said main terminals is connected to an output terminal of said external current source.

7. The controller as set forth in claim 5, wherein a rectifying diode is connected in parallel with said two main terminals of said controlling transistor, and the direction of said rectifying diode is set to flow current opposite to the direction of said base current which makes said power bipolar transistor being said "conduction" state.

8. The controller as set forth in claim 5, wherein a resistance of fixed value is connected in parallel with said two main terminals of said base-current-control transistor.

9. The controller as set forth in claim 5, in the case that said power bipolar transistor operates a load comprising an inductive load and a free wheeling diode for said inductive load, said second controlling device has further functions comprising:

function to accept a second signal bringing an information about a change of the states of said power bipolar transistor;

function to fix said resistance between said two main terminal of said base-current-control transistor when said detecting means detects the moment that the state of said power bipolar transistor begins to change from said "conduction" state to said "cut-off" state; and function to release said fixed-mode of said resistance when said detecting means detects both the moment that the state of said power bipolar transistor changes from said "cut-off" state to said "conduction" state and the moment that the current value passing through said collector terminal crosses the maximal value caused by the reverse recovery phenomenon of said free wheeling diode is detected.

10. The controller as set forth in claim 9, wherein said second signal is a signal which is similar to said first signal or the potential change of said output terminal of said first controlling device or a signal whose behavior is synchronized with the behavior of said first signal.

11. The controller as set forth in claim 9, wherein said second signal is said potential difference between said collector terminal and said emitter terminal.

12. The controller as set forth in claim 9, wherein said second signal is a signal triggered by the change of the direction of said base current.

13. The controller as set forth in claim 1, wherein one of said main terminals of said base-current-control transistor is connected to an output terminal of said first controlling device, and the other of said main terminals is connected to said base terminal.

14. The controller as set forth in claim 13, wherein one of said main terminals of said base-current-control transistor is connected to an output terminal of said first controlling device, and the other of said main terminals is connected to said base terminal.

15. The controller as set forth in claim 1, wherein a rectifying diode is connected in parallel with said two main terminals of said controlling transistor, and the direction of said rectifying diode is set to flow current opposite to the direction of said base current which makes said power bipolar transistor being said "conduction" state.

16. The controller as set forth in claim 1, wherein a resistance of fixed value is connected in parallel with said two main terminals of said base-current-control transistor.

17. The controller as set forth in claim 5, further comprising a load comprising an inductive load and a free wheeling diode for said inductive load, wherein said detecting means detects a current flowing through said inductive load to detect indirectly said current value.

18. A controller for a power bipolar transistor which has at least an emitter terminal and a collector terminal to flow the main current, said power bipolar transistor comprising a plurality of sub-transistors, each sub-transistor having a sub-collector terminal, a submitter terminal and a sub-base terminal, all said sub-collector terminals being connected with said main collector terminal, and all said sub-emitter terminals being connected to said main emitter terminal, said controller comprising;

(a) a first controlling device to give two states to the sum of the control currents which are to supply each sub-base terminal in response to a first signal to be applied from external, said two states being a "conduction" state and a "cut-off" state; and (b) a second controlling device at least including: a first detecting means to detect the condition of said power bipolar transistor while being in said "conduction" state;

a base-current-control transistor which has two main terminals to transfer said base current, and a control terminal for varying the value of resistance between said two main terminals to manage said condition of said power bipolar transistor of in said "conduction" state within a predetermined range in response to the detecting result of said first detecting means;

output terminals connecting with each sub-base terminal to control each sub-transistor individually;

second detecting means to detect each of sub-main current value passing between said sub-collector terminal and said sub-emitter terminal of each sub-transistor; and means for canceling the imbalance among said sub-main current values to modify each of sub-base current, said second controlling device operates independently of said first controlling device.

19. The controller as set forth in claim 18, wherein said condition which is detected by said first detecting means is the potential difference between said main collector terminal and said main emitter terminal, said cancelling means includes at least a plurality of base-current-balancing transistors, each of base-current-balancing transistor has two main terminals to transfer each sub-base current, and a control terminal for varying the value of resistance between said two main terminals to manage said condition of said sub-transistor in response to the detecting result of said second detecting means, one of the main terminal of said base-current-balancing transistor is connected to one of said sub-base terminal, and the other main terminal of said base-current-balancing transistor is connected to one of the main terminal of said base-current-control transistor, and the other of the main terminal of said base-current-control is connected to the output terminal of said first controlling device.

20. The controller as set forth in claim 19, wherein the number of said base-current-balancing transistors is same as the number of said sub-transistors.

21. The controller as set forth in claim 19, wherein the number of said base-current-balancing transistors is one smaller than the number of said sub-transistors.

* * * * *